(12) United States Patent
Luo et al.

(10) Patent No.: US 10,269,834 B2
(45) Date of Patent: Apr. 23, 2019

(54) TFT ARRAY FOR USE IN A HIGH-RESOLUTION DISPLAY PANEL AND METHOD FOR MAKING SAME

(71) Applicant: A.U. VISTA, INC., Milpitas, CA (US)

(72) Inventors: Fang-Chen Luo, Milpitas, CA (US); Willem Den Boer, Milpitas, CA (US); Hsiang-Lin Lin, Hsin-Chu (TW)

(73) Assignee: A.U. Vista, Inc., Milpitas, CA (US)

( * ) Notice: Subject to any disclaimer, the term of this patent is extended or adjusted under 35 U.S.C. 154(b) by 0 days.

(21) Appl. No.: 15/402,564

(22) Filed: Jan. 10, 2017

(65) Prior Publication Data
US 2018/0197898 A1 Jul. 12, 2018

(51) Int. Cl.
*H01L 27/12* (2006.01)
*H01L 27/15* (2006.01)
*H01L 49/02* (2006.01)
*H01L 29/423* (2006.01)

(52) U.S. Cl.
CPC ........ *H01L 27/1255* (2013.01); *H01L 27/124* (2013.01); *H01L 27/1248* (2013.01); *H01L 27/1259* (2013.01); *H01L 28/91* (2013.01); *H01L 29/42392* (2013.01)

(58) Field of Classification Search
CPC ............... H01L 27/1255; H01L 27/124; H01L 27/1248
See application file for complete search history.

(56) References Cited

U.S. PATENT DOCUMENTS

| | | | |
|---|---|---|---|
| 5,146,301 A | 9/1992 | Yamamura et al. | |
| 6,927,087 B2 | 8/2005 | Lai | |
| 7,170,092 B2 | 1/2007 | Lai et al. | |
| 7,250,992 B2 | 7/2007 | Lai | |
| 7,345,717 B2 | 3/2008 | Lai | |
| 7,507,612 B2 | 3/2009 | Lai et al. | |
| 7,605,395 B2 | 10/2009 | Song et al. | |
| 7,652,285 B2 | 1/2010 | Chen | |
| 2009/0289259 A1* | 11/2009 | Huang | H01L 28/40 257/72 |
| 2010/0140623 A1 | 6/2010 | Min et al. | |
| 2010/0320466 A1 | 12/2010 | Chen et al. | |
| 2011/0058116 A1 | 3/2011 | Yamazaki et al. | |
| 2014/0022480 A1* | 1/2014 | Yokoyama | H01L 29/42356 349/43 |

* cited by examiner

*Primary Examiner* — Robert Bachner
*Assistant Examiner* — Molly Reida
(74) *Attorney, Agent, or Firm* — Ware, Fressola, Maguire & Barber LLP

(57) ABSTRACT

A pixel structure for use in a display panel includes a switching element and a storage capacitor. The switching element has a drain electrode and a source electrode disposed on a high-k dielectric layer with k being equal to or higher than 8. The storage capacitor has a first capacitor electrode, a second capacitor electrode and a third capacitor electrode, wherein a passivation layer is disposed between the second an third capacitor electrodes and the high-k dielectric layer is also disposed between the first and second capacitor electrodes. The pixel structure also has a common line connected to the first capacitor electrode, a source line, and a gate line arranged such that the source line, the gate line and the common line may cross over each other over a low-k dielectric layer at a cross-over area where k is equal to or lower than 5.

22 Claims, 24 Drawing Sheets

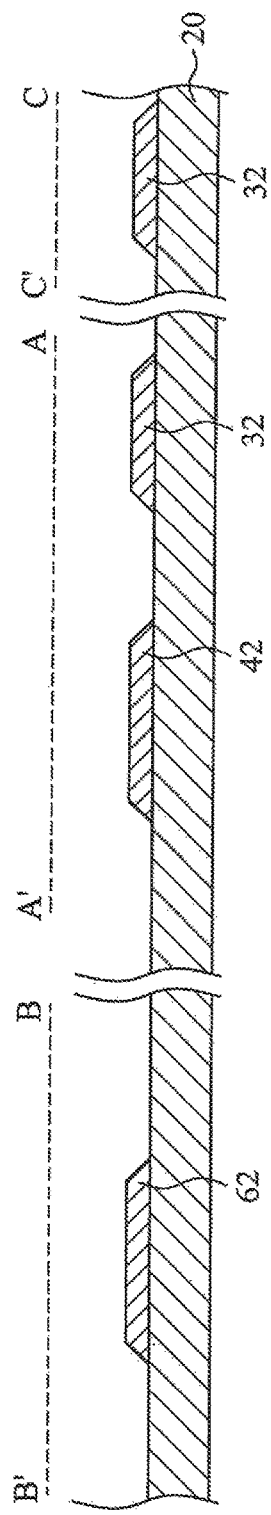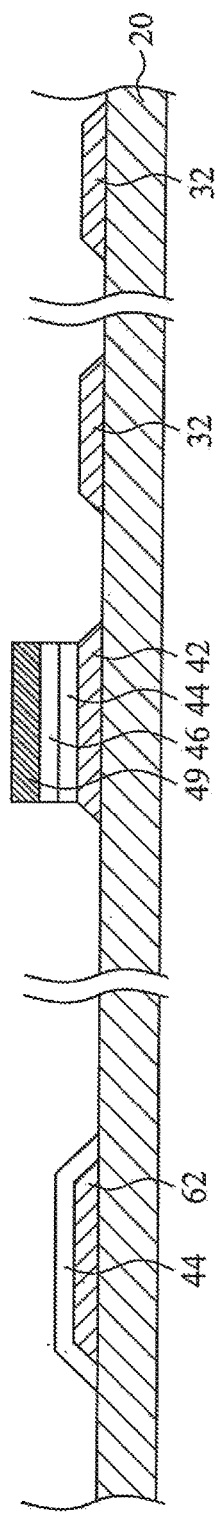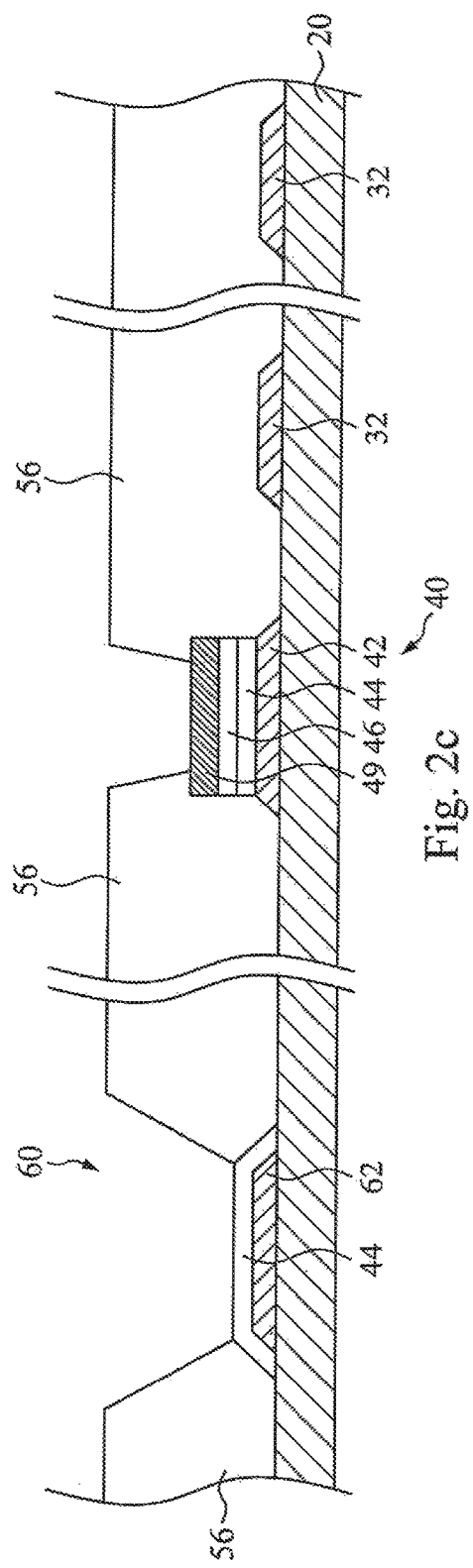

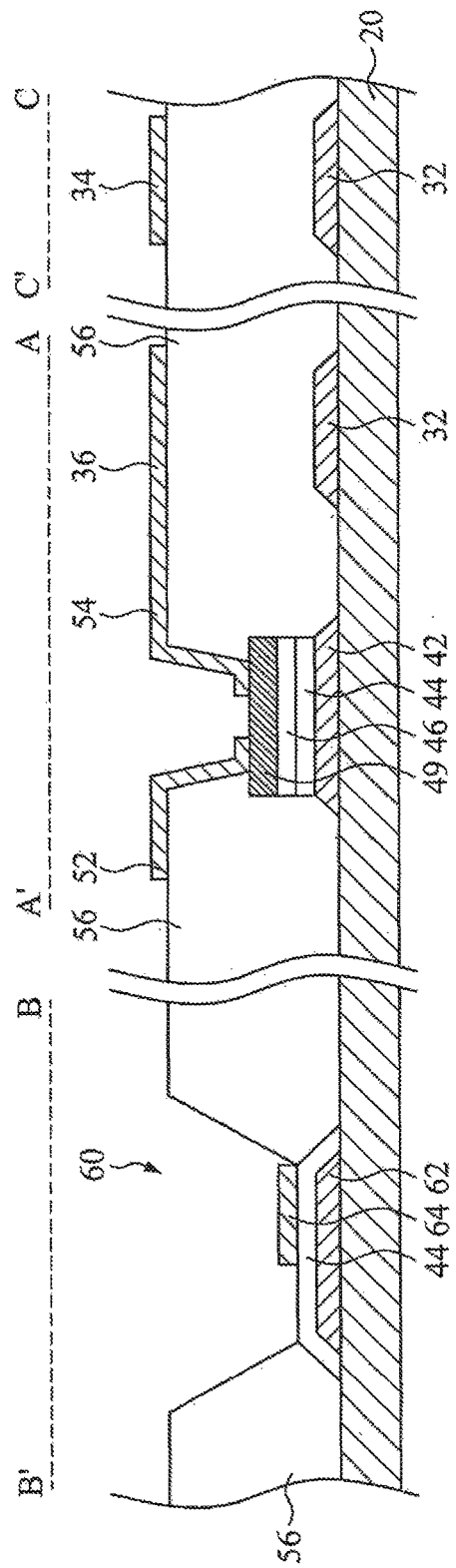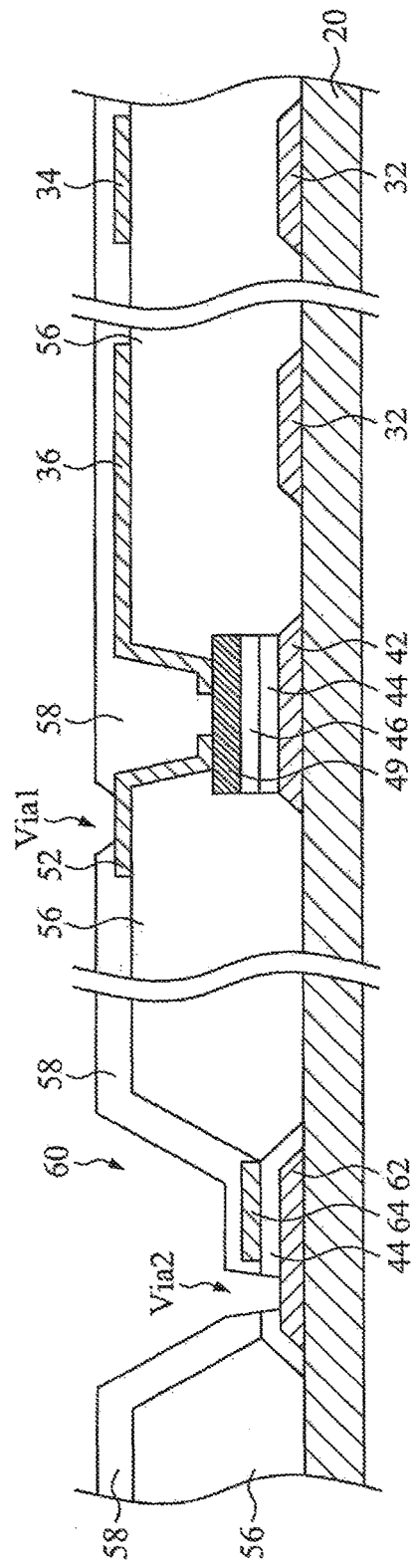

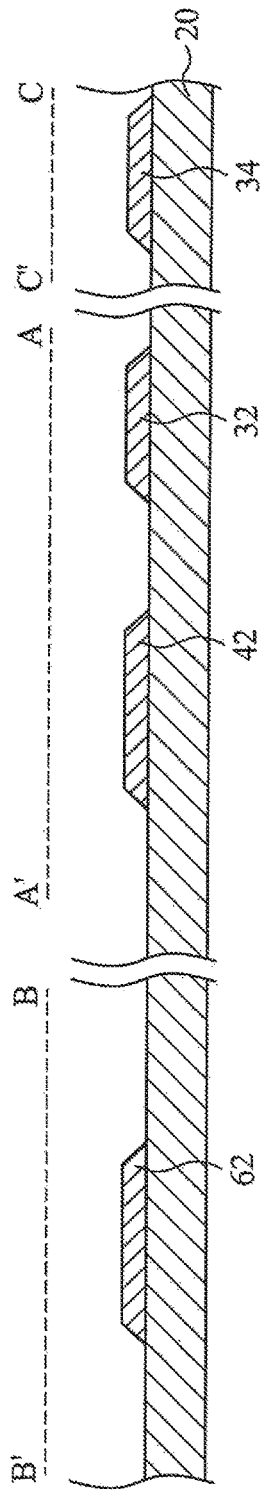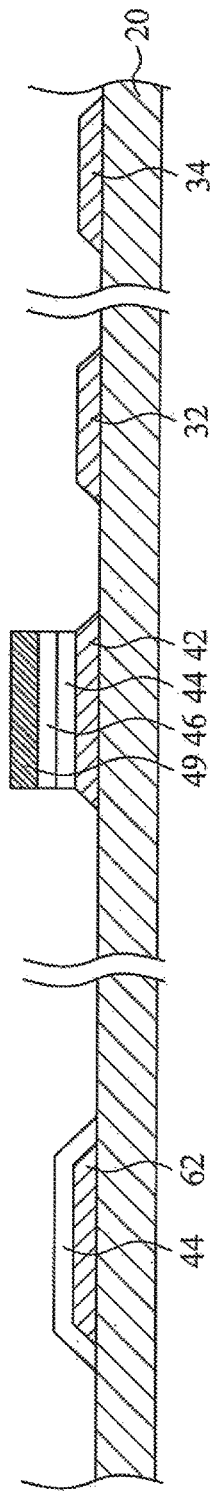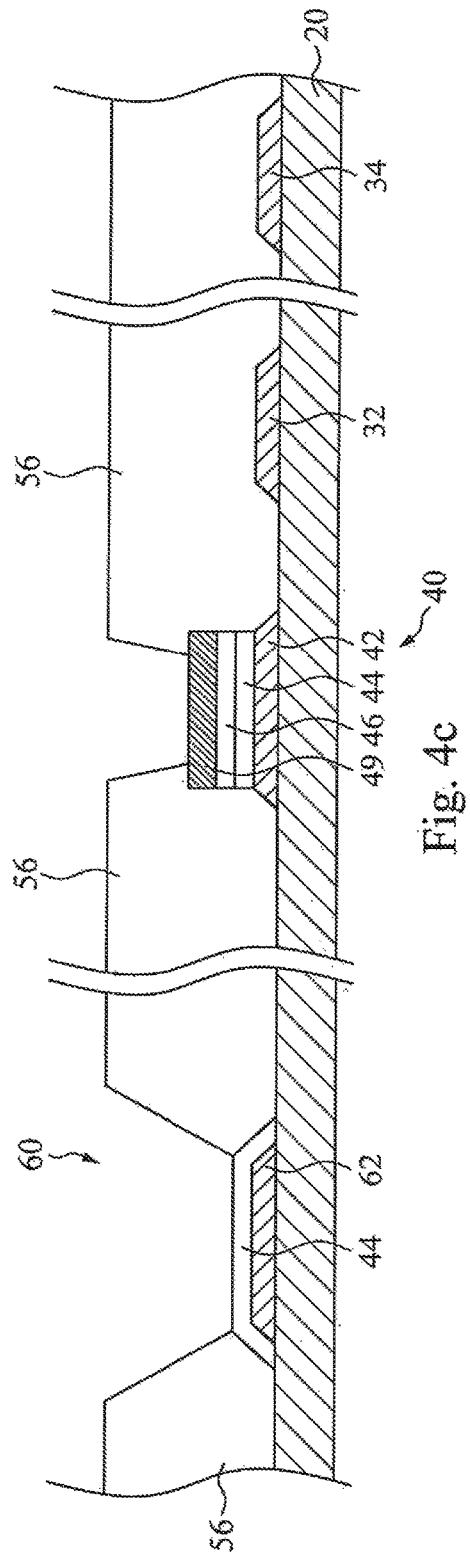
Fig. 4a
Fig. 4b
Fig. 4c

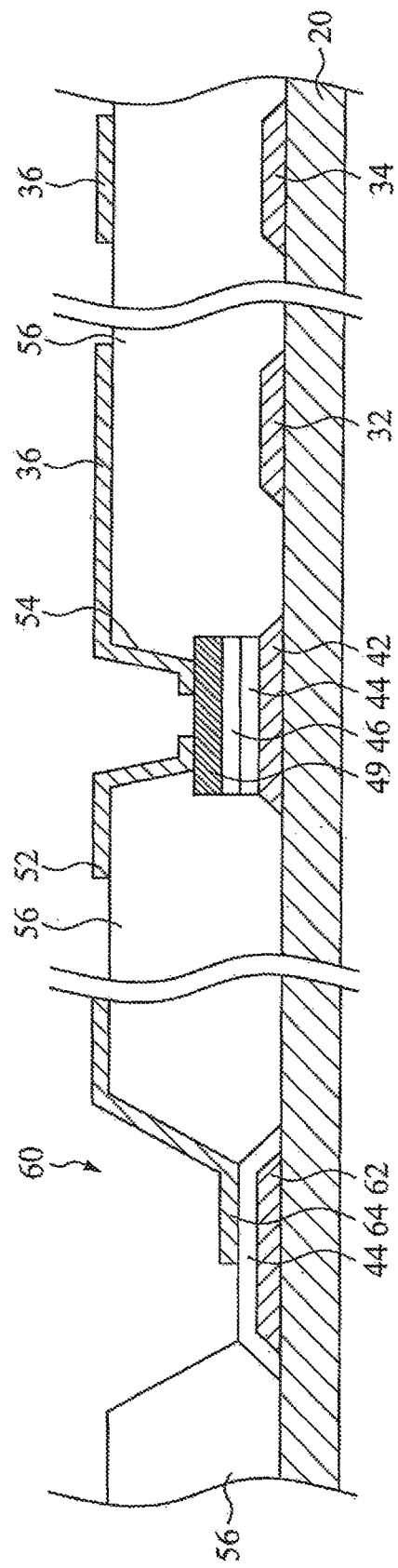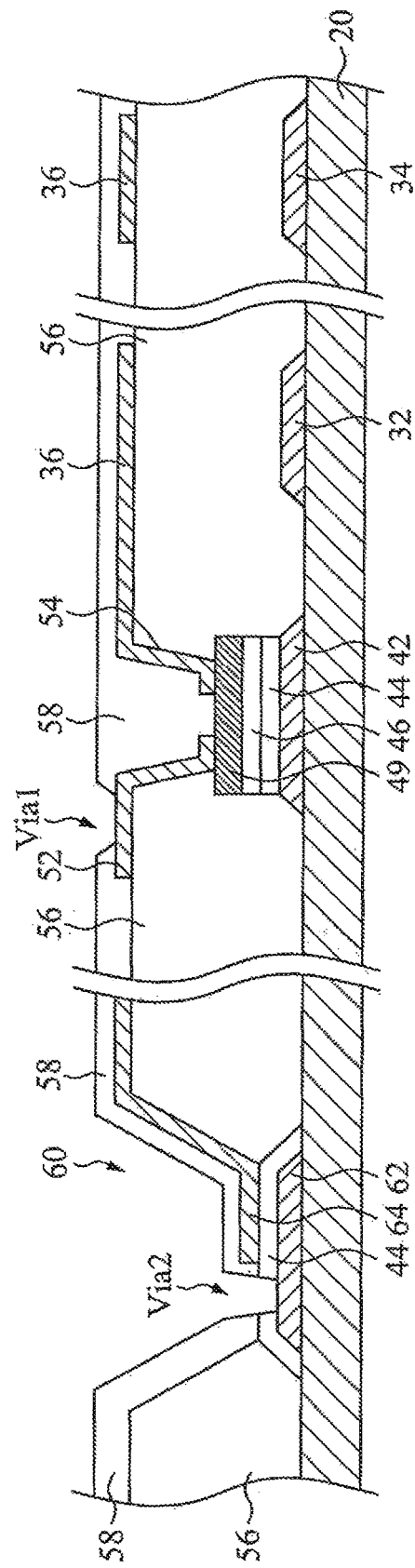

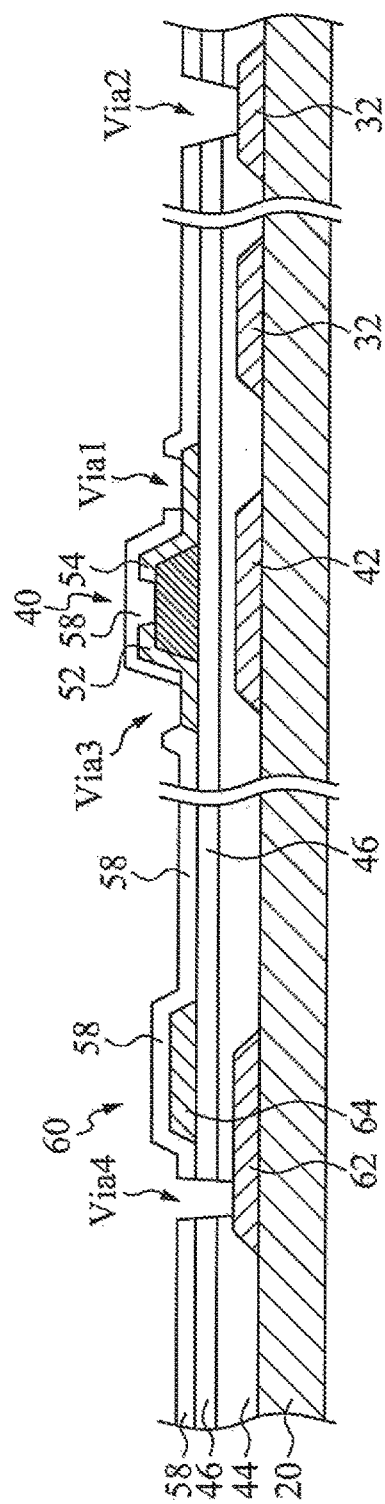
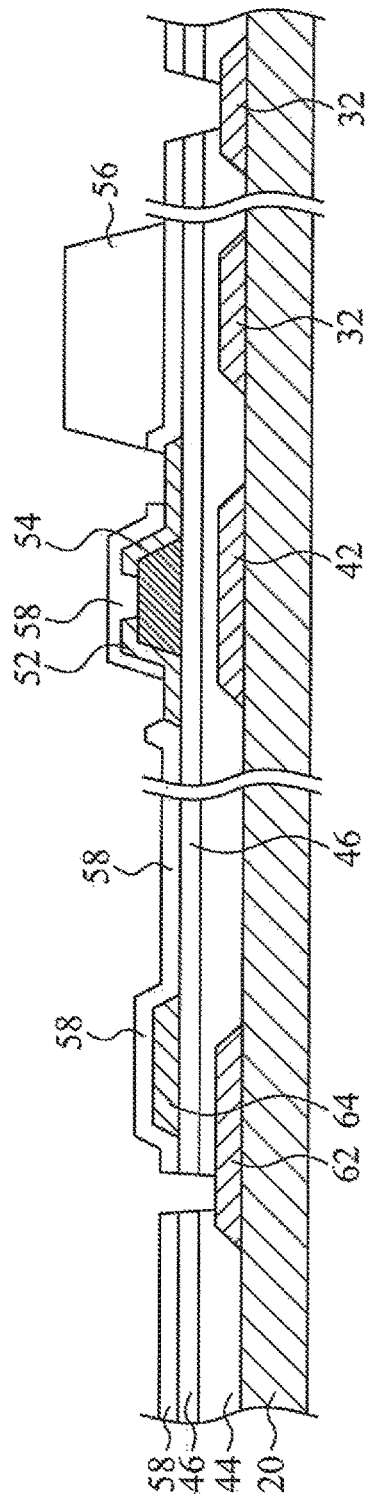
Fig. 8d
Fig. 8e

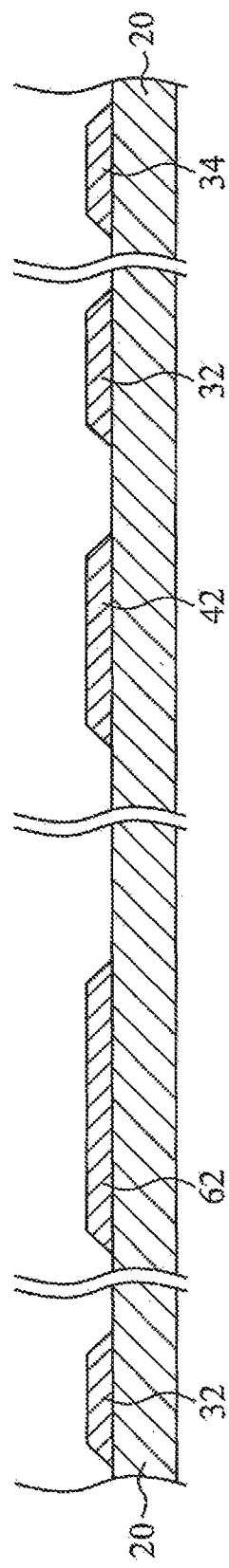
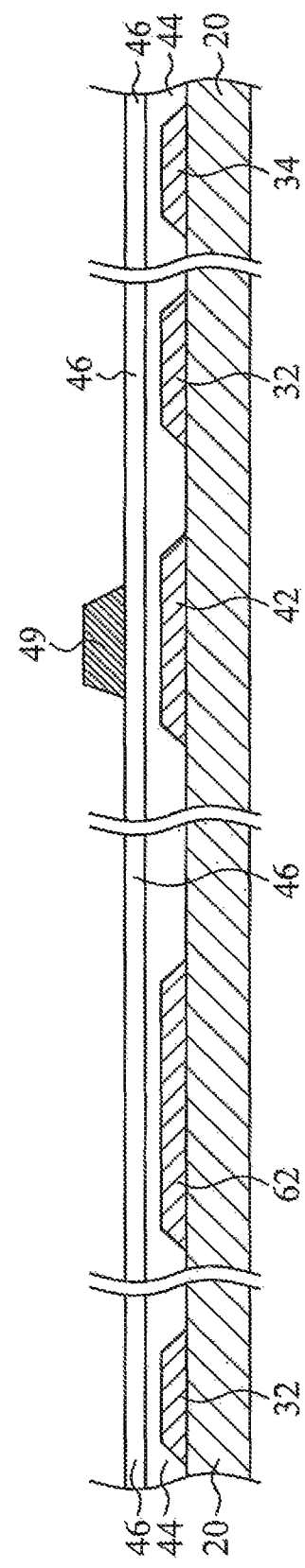
Fig. 10a
Fig. 10b

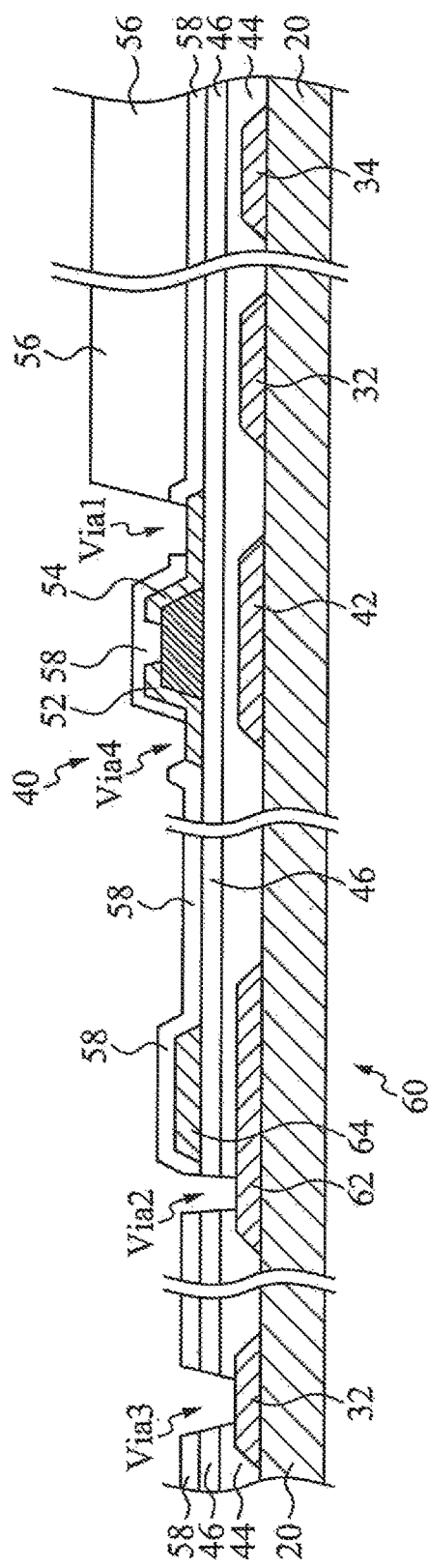
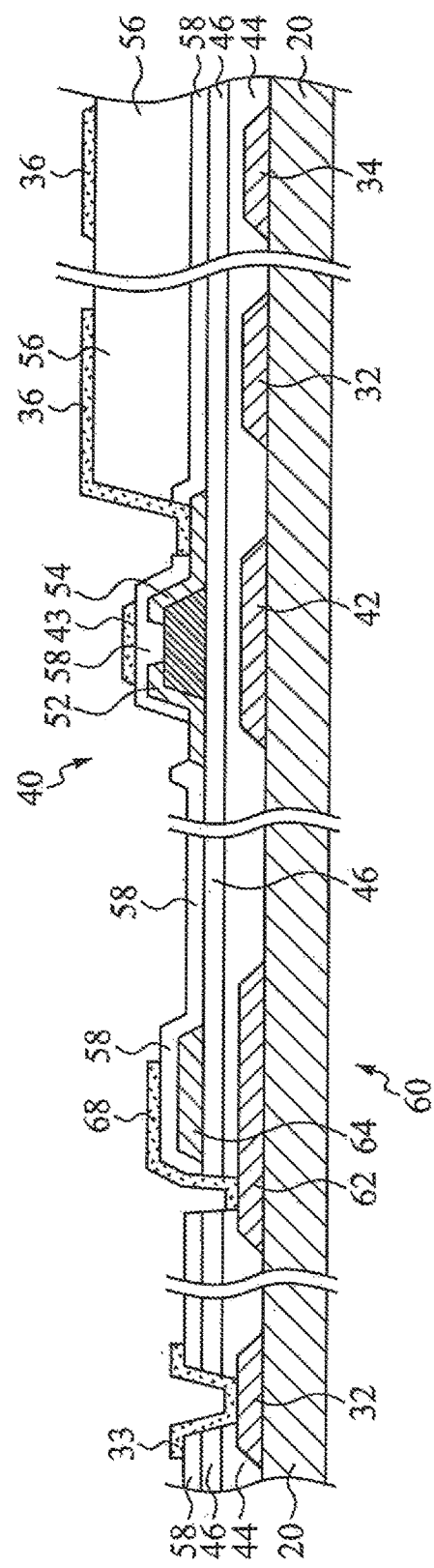
Fig. 10e
Fig. 10f

TFT ARRAY FOR USE IN A HIGH-RESOLUTION DISPLAY PANEL AND METHOD FOR MAKING SAME

TECHNICAL FIELD

The present invention relates generally to a display panel and, more specifically, to an active matrix substrate having a TFT array for driving the display panel.

BACKGROUND OF THE INVENTION

A display panel generally has a large number of pixels arranged in a two dimensional array. To drive the display panel, an active matrix substrate includes a large number of switching elements made of thin-film transistors or TFTs to activate the pixels.

It is known in the art that each switching element has a drain electrode, a source electrode and a gate electrode and each pixel has a pixel electrode and a storage capacitor to store electric charges between the pixel electrode and a common line. As the size of the TFT-driven display panel becomes large and its resolution becomes high, the addressing time of the pixels becomes very short and the capacitance loading of the display panel becomes high, causing the charging time of the display pixel to decrease significantly.

Each pixel in the array of pixels may be configured as disclosed, for example, in Lai, U.S. Pat. No. 7,250,992 and in its continuation U.S. Pat. No. 7,345,717, both of which are assigned to AU Optronics Corp., the parent company of the assignee of the current application, and both of which are hereby incorporated by reference in their entireties. As shown in Lai FIG. 1, each pixel may comprise a rectangular region defined by a pair of gate lines (scan lines) and a pair of data lines (signal lines). Disposed within the rectangular region may be a TFT serving as a switching device and a pixel electrode. The gate of the TFT may extend from one of the gate lines that define the pixel, the source of the TFT may extend from one of the data lines that define the pixel, and the drain of the TFT may be electrically connected to the pixel electrode through a via.

As further described in Lai, the gate and data lines, the TFTs, and the pixel electrodes may be formed using a multi-layer process. For example, the gate lines and TFT gates may be formed in a first metal process layer, and the data lines and TFT sources and drains may be formed in a second metal process layer. As described in Lai, the presence of overlapping metal layers will result in parasitic capacitance between the source and gate and between the drain and gate of the TFT. Shifts in the alignment of the two process layers may cause the values of these parasitic capacitances to change, producing undesirable effects during the operation of the display. As disclosed in Lai, a compensation capacitor may be formed by a compensation structure that extends from at least one of the gate and the gate line and that overlaps a portion of the drain. The configuration of the compensation structure may be such that the sum of the gate-drain parasitic capacitance and the capacitance between the drain and the compensation structure maintains a substantially constant value as the alignment between the two metal process layers shifts.

The TFTs, gate and data lines, and pixel electrodes may be formed in a multilayer structure such as that shown in FIGS. 1 and 2E of Lai et al., U.S. Pat. No. 7,170,092 and in its division U.S. Pat. No. 7,507,612, both of which are assigned to AU Optronics Corp., the parent company of the assignee of the current application, and both of which are hereby incorporated by reference in their entireties. The multilayer structure may comprise a first conducting layer, a first insulating layer, a semiconductor layer, a doped semiconductor layer, and a second conducting layer disposed in sequence on the substrate. It may further comprise a second insulating layer and a pixel electrode disposed on the second insulating layer. The first conducting layer may comprise at least one of a gate line or a gate electrode. The doped semiconductor layer may comprise a source and a drain. The second conducting layer may comprise a source electrode and a drain electrode. The multilayer structure may be formed using a series of wet and dry etching processes, for example as disclosed in Lai et al. FIGS. 2A-2D.

Additional techniques for forming TFTs are disclosed in Chen, U.S. Pat. No. 7,652,285, which is assigned to AU Optronics Corp., the parent company of the assignee of the current application, and hereby incorporated by reference in its entirety. As disclosed in Chen, to form the channel of the TFT, the second metal layer is etched in order to open a portion of the second metal layer over the gate electrode and to separate the source region and drain region. This etching can be performed in multiple ways, including the back-channel etching process disclosed for example in Chen FIGS. 2A-2E and the etch stop process disclosed for example in Chen FIGS. 5A-5D and 6.

Accordingly, it is desired to develop a display panel that realizes improved performance while maintaining a comparatively low manufacturing cost.

SUMMARY OF THE DISCLOSURE

The present invention provides a pixel structure in a display panel. The pixel structure includes a switching element and a storage capacitor. The switching element has a drain electrode and a source electrode disposed on a high-k dielectric layer with a dialect constant k being equal to or higher than 8. The storage capacitor has a first capacitor electrode, a second capacitor electrode and a third capacitor electrode, wherein a passivation layer is disposed between the second an third capacitor electrodes and the high-k dielectric layer is also disposed between the first and second capacitor electrodes. The pixel structure also has a common line connected to the first capacitor electrode, a source line, and a gate line arranged such that two of the source line, the gate line and the common line may cross over each other over a low-k dielectric layer at a cross-over area where the dielectric constant k is equal to or lower than 5. Thus, the first aspect of the prevent invention is a pixel structure for use in a display panel having a substrate, the pixel structure comprising:

a switching element comprising:
    a gate electrode disposed on the substrate,
    a first dielectric layer disposed on the gate electrode,
    a semiconductor layer disposed on the first dielectric layer, and
    a drain electrode and a source electrode disposed on the semiconductor layer, the first dielectric layer having a dielectric constant equal to or higher than 8;
    a storage capacitor comprising a first capacitor electrode, a second capacitor electrode, a third capacitor electrode, a passivation layer disposed between the second capacitor electrode and the third capacitor electrode, and a second dielectric layer disposed between the first capacitor electrode and the second capacitor electrode, the second dielectric layer having a dielectric constant equal to or higher than 8;

a pixel electrode electrically connected to the drain electrode;

a first signal line electrically connected to the source electrode;

a second signal line electrically connected to the gate electrode; and a common line electrically connected to the storage capacitor, wherein two of the first signal line, the second signal line and the common line are arranged to cross over each other over a third dielectric layer at a cross-over area, the third dielectric layer having a dielectric constant equal to or lower than 5. The passivation layer has a dielectric constant higher than 5.

According to an embodiment of the present invention, the switching element further comprises an insulating layer disposed between the first dielectric layer and the semiconductor.

According to an embodiment of the present invention, the switching element further comprises:

a further passivation layer disposed on the drain electrode and the source electrode, and a second gate electrode disposed on the further passivation layer, the second gate electrode electrically connected to the gate electrode through a via. The further passivation layer has a dielectric constant higher than 5.

According to an embodiment of the present invention, the first signal line and the second signal line are arranged to cross over each other at a first cross-over area, and the common line and the second signal line are arranged to cross over each other at a second cross-over area, and wherein the third dielectric layer is disposed between the first signal line and the second signal line at least at the first cross-over area and between the common line and the second signal line at least at the second cross-over area.

According to an embodiment of the present invention, the first signal line and the second signal line are arranged to cross over each other at a first cross-over area, and the common line and the first signal line are arranged to cross over each other at a second cross-over area, and wherein the third dielectric layer is disposed between the first signal line and the second signal line at least at the first cross-over area and between the common line and the first signal line at least at the second cross-over area.

According to an embodiment of the present invention, the pixel structure further comprises:

a fourth dielectric layer disposed on the second signal line; and a further passivation layer disposed on the fourth dielectric layer and on the common line, the fourth dielectric layer having a dielectric constant equal to or higher than 8, wherein the first signal line and the second signal line are arranged to cross over each other at a first cross-over area, and the common line and the first signal line are arranged to cross over each other at a second cross-over area, and wherein the third dielectric layer is disposed on the further passivation layer between the first signal line and the second signal line at least at the first cross-over area, and on the further passivation layer between the common line and the first signal line at least at the second cross-over area.

According to an embodiment of the present invention, the pixel structure further comprises an insulating layer disposed between the fourth dielectric layer and the further passivation layer at least at the first cross-over area and between the fourth dielectric layer and the common line at least at the second cross-over area.

According to an embodiment of the present invention, the pixel structure further comprises:

a fourth dielectric layer disposed on the second signal line and the common line; and a further passivation layer disposed on the fourth dielectric layer, the fourth dielectric layer having a dielectric constant equal to or higher than 8, wherein the first signal line and the second signal line are arranged to cross over each other at a first cross-over area, and wherein the third dielectric layer is disposed on the further passivation layer between the first signal line and the second signal line at least at the first cross-over area.

According to an embodiment of the present invention, the pixel structure also comprises an insulating layer disposed between the fourth dielectric layer and the passivation layer at least at the first cross-over area.

According to an embodiment of the present invention, the common line and the first signal line are arranged to cross over each other at a second cross-over area, and wherein the third dielectric layer is disposed on the further passivation layer also between the common line and the first signal line at least at the second cross-over area.

According to an embodiment of the present invention, the pixel structure also has an insulating layer disposed between the fourth dielectric layer and the passivation layer at least at the first cross-over area and the second cross-over area.

According to an embodiment of the present invention, the pixel electrode is electrically connected to the drain electrode, the third capacitor electrode is electrically connected to the pixel electrode, the second capacitor electrode is electrically connected to common line, and the first capacitor electrode is electrically connected to the third capacitor electrode through a via.

According to an embodiment of the present invention, the first capacitor electrode is electrically connected to the common line, the second capacitor electrode is electrically connected to the drain electrode, and the first capacitor electrode is electrically connected to the third capacitor electrode through a via.

According to an embodiment of the present invention, the third capacitor electrode is electrically connected to the pixel electrode, the second capacitor electrode is electrically connected to the common line, and the first capacitor electrode is electrically connected to the third capacitor electrode through a via and wherein the storage capacitor further comprises an insulating layer between the second capacitor electrode and the second dielectric layer.

According to an embodiment of the present invention, the storage capacitor further comprises a fourth dielectric layer disposed between the third capacitor electrode and the passivation layer, wherein the fourth dielectric layer having a dielectric constant equal to or lower than 5.

According to an embodiment of the present invention, the first capacitor electrode is electrically connected to the common line, the second capacitor electrode is electrically connected to the drain electrode and the third capacitor electrode is electrically connected to the first capacitor electrode through a via, and the storage capacitor further comprises an insulating layer disposed between the second capacitor electrode and the second dielectric layer.

According to an embodiment of the present invention, the first dielectric layer and the second dielectric layer are made from a material selected from the group consisting of $Al_2O_3$, $Ta_2O_5$ and $HfO_2$.

The second aspect of the present invention is also a pixel structure in a display panel having a substrate. The pixel structure comprises:

a switching element comprising:
a gate electrode disposed on the substrate,
a semiconductor layer adjacent to the gate electrode, and
a drain electrode and a source electrode disposed on the semiconductor layer; and
a storage capacitor comprising a first capacitor electrode, a second capacitor electrode a third capacitor electrode, and a passivation layer disposed between the second capacitor electrode and the third capacitor electrode, the first capacitor electrode disposed on the substrate, wherein a dielectric material is provided between the first capacitor electrode and the second capacitor electrode in the storage capacitor, and between the gate electrode and the semiconductor layer in the switching element, the dielectric material having a dielectric constant higher than 8.

According to an embodiment of the present invention, the pixel structure further comprises:
a pixel electrode electrically connected to the drain electrode;
a first signal line electrically connected to the source electrode;
a second signal line electrically connected to the gate electrode;
a common line electrically connected to the second capacitor electrode of the storage capacitor; and
a dielectric layer disposed at least on the second signal line, wherein the first signal line and the second signal line are arranged to cross over each other over the dielectric layer at a cross-over area, the dielectric layer having a dielectric constant equal to or lower than 5.

According to an embodiment of the present invention, the second signal line and the common line are arranged to cross over each other over the dielectric layer at a different cross-over area.

According to an embodiment of the present invention, the dielectric material is also provided over the second signal line at least at the cross-over area between the first signal line and the second signal line.

According to an embodiment of the present invention, the pixel structure further comprises:
a passivation layer disposed on the drain electrode, the source electrode and a part of the semiconductor layer in the switching element, and
a second gate electrode disposed on the passivation layer over the switching element, the second gate electrode electrically connected to the gate electrode through a via, and wherein the passivation layer is also disposed between the dielectric layer and the second signal line at least at the cross over area.

The third aspect of the present invention is a method for fabricating a pixel structure for use in a display panel having a substrate, the pixel structure comprising a switching element, a storage capacitor, a pixel electrode, a first signal line, a second signal line and a common line, wherein
the switching element comprises:
a gate electrode,
a semiconductor layer, and
a drain electrode and a source electrode; and
the storage capacitor comprising a first capacitor electrode, a second capacitor electrode and a third capacitor electrode. The method comprises the steps of:
disposing a first metal layer on the substrate for providing the first capacitor electrode, the gate electrode and the second signal line, wherein the first capacitor electrode, the gate electrode, and the second signal line are spaced from each other; and disposing a first dielectric material for providing a first dielectric layer on the gate electrode and a second dielectric layer on the first capacitor electrode, the first dielectric material having a dielectric constant equal to or higher than 8.

According to an embodiment of the present invention, the method further comprises the steps of:
disposing a semiconducting material on the first dielectric layer for providing the semiconductor layer;
disposing a second dielectric material for providing a third dielectric layer on part of the substrate at least between the gate electrode and the first capacitor electrode, and a fourth dielectric layer on the second signal line and on another part of the substrate at least between the second signal line and the gate electrode, the second dielectric material having a dielectric constant equal to or lower than 5;
disposing a second metal layer for providing
the drain electrode and the source electrode of the switching element,
the second capacitor electrode of the storage capacitor, and
the first signal line and the common line on the fourth dielectric layer, wherein two of the first signal line, the second signal line and the common line are arranged to cross over each other at a cross-over area such that the second dielectric material is at least disposed at the cross-over area;
disposing a passivation layer over the second capacitor electrode and the third dielectric layer; and
disposing an electrically conductive layer on part of the passivation layer for providing the third capacitor electrode and the pixel electrode, the pixel electrode electrically connected to the drain electrode through a first via, the third capacitor electrode electrically connected to the first capacitor electrode through a second via.

According to an embodiment of the present invention, the first dielectric material comprises a continuous layer over the gate electrode, the first capacitor electrode and the second signal line, and the method further comprises the steps of:
disposing an insulating layer on the first dielectric material;
disposing a semiconducting material on part of the insulating layer for providing the semiconductor layer of the switching element;
disposing a second metal layer on the semiconductor layer and part of the insulating layer for providing the drain electrode and the source electrode of the switching element, and on a different part of the insulating layer for providing the common line and the second capacitor electrode of the storage capacitor;
disposing a passivation layer at least over the drain electrode and the source electrode of the switching element, the second capacitor electrode of the storage capacitor, and the common line;
disposing a second dielectric material over the passivation layer, the second dielectric material having a dielectric constant equal to or lower than 5;
patterning the passivation layer and the second dielectric material to provide a first via to the source electrode, a second via to the drain electrode, and patterning the insulating layer, the passivation layer, the second dielectric material and the first dielectric material to provide a third via to the first capacitor electrode;
disposing a third metal layer on part of the second dielectric material for providing the first signal line, the first signal line electrically connected to the source electrode through the first via, the first signal line also crossing over the common line, and disposing an electrically conductive layer over a different part of the second dielectric material for providing a pixel electrode, wherein the pixel electrode is electrically connected to the drain electrode through the second via and connected to the first capacitor electrode through the third via.

According to an embodiment of the present invention, the first dielectric material comprising a continuous layer over the gate electrode, the first capacitor electrode, a first segment of the second signal line and a second segment of the second signal line, and the method further comprises the steps of:

disposing an insulating layer on the first dielectric material;

disposing a semiconducting material on part of the insulating layer for providing the semiconductor layer of the switching element;

disposing a second metal layer on the semiconductor layer and part of the insulating layer for providing the drain electrode and the source electrode of the switching element, and on a different part of the insulating layer for providing the second capacitor electrode of the storage capacitor;

disposing a passivation layer over the drain electrode and the source electrode of the switching element, the second capacitor electrode of the storage capacitor, the first segment of the second signal line and the second segment of the second signal line;

patterning the passivation layer to provide a first via to the source electrode and a third via to the drain electrode, and patterning the passivation layer, the insulating layer and the first dielectric material to provide a second via to the first segment of the second signal line and a fourth via to the first capacitor electrode;

disposing a second dielectric material on the passivation layer over the second segment of the second signal line, the second dielectric material having a dielectric constant lower than or equal to 5;

disposing a third metal layer on the second dielectric material for providing the first signal line, and on part of the passivation layer for providing a second gate electrode in the switching element, the second gate element electrically connected to the first segment of the second signal line through the second via; and disposing an electrically conducting layer on a different part of the passivation layer for providing a pixel electrode, the pixel electrode electrically connected to the drain electrode through the third via and connected to the first capacitor electrode through the fourth via.

According to an embodiment of the present invention, the first metal layer also provides a common line on the substrate, and the first dielectric material is a continuous layer disposed on the gate electrode, the first capacitor electrode, a first segment of the second signal line and the second segment of the second signal line, and the method further comprises the steps of:

disposing an insulating layer on the first dielectric material;

disposing a semiconducting material on part of the insulating layer for providing the semiconductor layer of the switching element;

disposing a second metal layer on the semiconductor layer and part of the insulating layer for providing the drain electrode and the source electrode of the switching element, and on another part of the insulating layer for providing the second capacitor electrode of the storage capacitor;

disposing a passivation layer over the drain electrode and the source electrode of the switching element, the second capacitor electrode of the storage capacitor, the common line, the first segment of the second signal line, the second segment of the second signal line and different part of the insulating layer;

patterning the passivation layer to provide a first via to the source electrode and a fourth via to the drain electrode, and patterning the passivation layer, the insulating layer and the first dielectric material to provide a second via to the first capacitor electrode, and a third via to the first segment of the second signal line;

disposing a second dielectric material on the passivation layer over the second segment of the second signal line and the common line, the second dielectric material having a dielectric constant lower than or equal to 5;

disposing and patterning a third metal layer
    on the second dielectric material for providing the first signal line over the second segment of the second signal line and the common line, the first signal line electrically connected to the source electrode through the first via, and
    on part of the passivation layer for providing a third capacitor electrode and a second gate electrode in the switching element, the second gate electrode electrically connected to the first segment of the second signal line through the third via, the third capacitor electrode electrically connected to the first capacitor electrode through the second via; and disposing an electrically conducting layer on different part of the passivation layer for providing the pixel electrode, the pixel electrode electrically connected to the drain electrode through the fourth via.

According to an embodiment of the present invention, the second metal layer is also disposed on the insulating layer for providing the common line, the common line and the second signal line arranged to cross over each other at a cross-over area;

the second metal layer is patterned to produce a gap in the common line at the cross-over area;

the passivation layer is also disposed on the common line and on the insulating layer at the gap of the common line;

the second dielectric material is also disposed on the passivation layer to provide a dielectric segment at the cross-over area, and the third metal layer is also disposed on the dielectric segment of the second dielectric material at the cross-over area for providing a bridge electrically connecting the common line on both sides of the gap.

The present invention will become apparent upon reading the description in conjunction with FIGS. 1 to 13.

BRIEF DESCRIPTION OF THE DRAWINGS

FIGS. 2a-2e show the steps for fabricating an active matrix substrate as shown in FIG. 2.

FIGS. 4a-4e show the steps for fabricating an active matrix substrate as shown in FIG. 4.

FIGS. 8a-8g show the steps for fabricating an active matrix substrate as shown in FIG. 8.

FIGS. 10a-10f show the steps for fabricating an active matrix substrate as shown in FIG. 10.

DETAILED DESCRIPTION OF THE INVENTION

Figure 1:
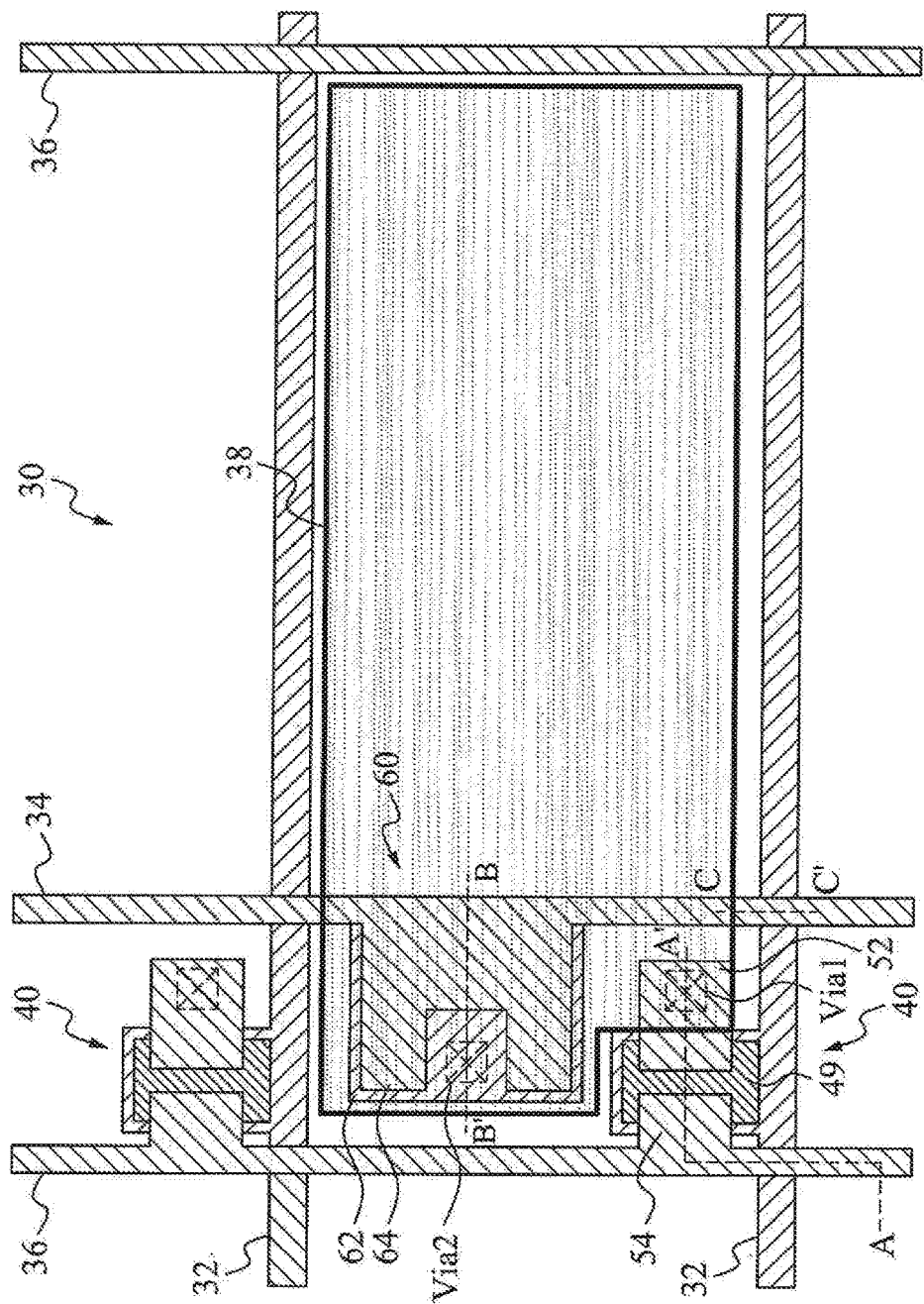
FIG. 1 is a top view of a pixel, according to an embodiment of the present invention.

The present invention provides a pixel structure in a pixel for used in a display panel that reduces the cross-over capacitance, increase the capacitance per area ratio of the storage capacitor and improves the transconductance of the switching element in each of the pixels. More specifically, a high-k insulator or dielectric material is used in the switching element and in the storage capacitor, and a low-k dielectric material is used as a cross-over insulator. The high-k dielectric material has a dielectric constant equal to or higher than 8 and the low-k dielectric material has a dielectric constant equal to or lower than 5. Examples of the high-k dielectric material include, but not limit to, $Al_2O_3$, $Ta_2O_5$ and $HfO_2$. An example of the low-k dielectric material is acrylic insulator, but not limited thereto.

For explanation purposes, the various components and layers associated with the pixel structure, according to various embodiments of the present invention, are designated with the following reference numerals:

20 substrate
30 pixel
32 gate line
34 common line
36 source line
38 pixel electrode
40 TFT
42 gate electrode or gate electrode 1
43 second gate electrode
44 high-k dielectric layer
46 insulating layer
49 semiconductor layer
52 drain electrode
54 source electrode
56 low-k dielectric layer
58 passivation layer
60 storage capacitor
62 first capacitor electrode
64 second capacitor electrode
68 third capacitor electrode The present invention includes a number of different embodiments as illustrated in Examples 1-6, but not limited thereto.

EXAMPLE 1

Figure 2:
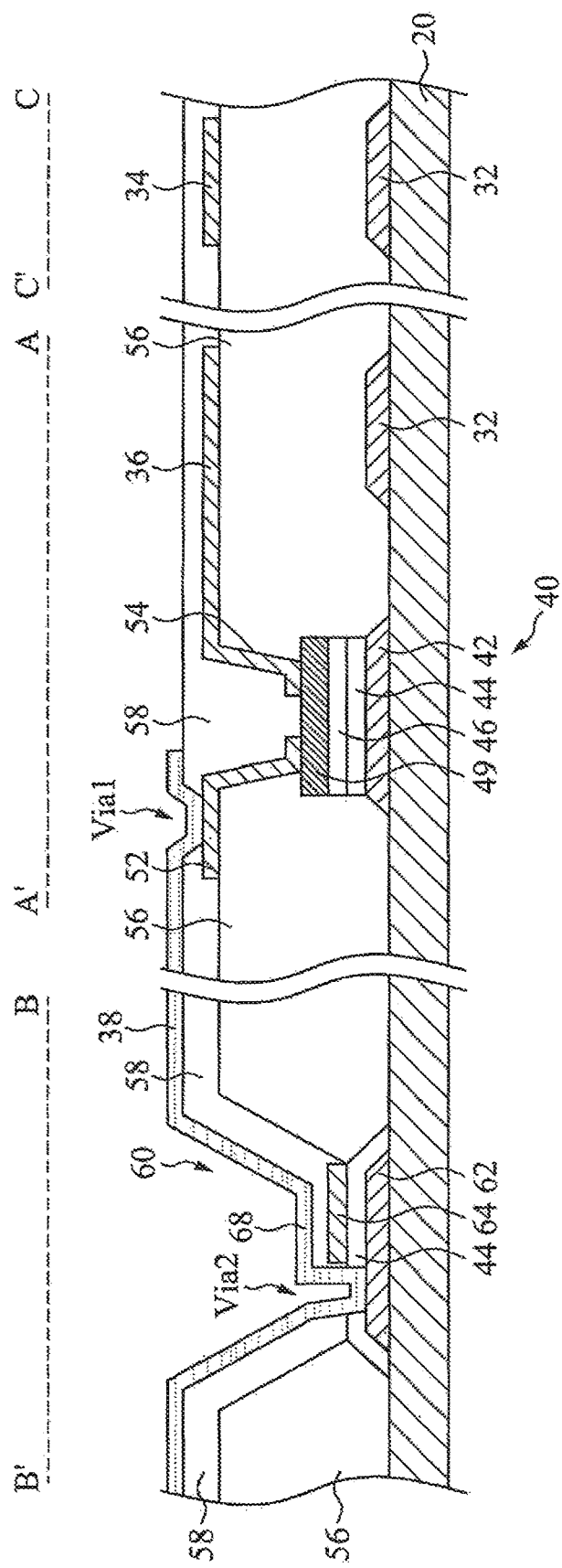
FIG. 2 is a cross-sectional view of the pixel of FIG. 1, along various paths marked as A'-A, B'-B and C'-C.

The embodiment of Example 1 is illustrated in FIG. 1 to FIG. 2e, in which FIG. 1 is a top view of a pixel, FIG. 2 is a cross-sectional view of the pixel of FIG. 1 along various paths marked as A'-A, B'-B and C'-C, and FIGS. 2a-2e show the steps for fabricating the pixel structure in a pixel in an active matrix substrate as shown in FIG. 2.

As seen in FIG. 1, the pixel 30 is defined by an area between two source lines 36 and two gate lines 32. The pixel 30 has a switching element or TFT 40, a storage capacitor 60 and a common line 34 substantially parallel to the source line 36. As seen in FIG. 2, the storage capacitor 60 is shown in the cross-sectional view along path B'-B; the TFT 40 and the cross-over area between the source line 36 and the gate line 32 are shown in the cross-sectional view along path A'-A, and the cross-over area between the common line 34 and the gate line 32 is shown in the cross-sectional view along path C'-C. The storage capacitor 60 has a first capacitor electrode 62, a second capacitor electrode 64 and a third capacitor electrode 68 which is a part of the pixel electrode 38. A high-k dielectric layer 44 is provided between the first capacitor electrode 62 and the second capacitor electrode 64, and also in the TFT 40. A passivation layer 58 is provided between the second capacitor electrode 64 and the third capacitor electrode 68. The passivation layer 58 has a dielectric constant higher than 5. The third capacitor electrode 68 and first capacitor electrode 62 are electrically connected through a via (Via2). The TFT 40 has a gate electrode 42 disposed on a substrate 20, a high-k dielectric layer 44 disposed on the gate electrode 42, a semiconductor layer 49 disposed adjacent to the high-k dielectric layer 44, and an optional insulating layer 46 such as a silicon nitride ($SiN_x$) layer between the high-k layer 44 and the semiconductor layer 49. The TFT 40 has a drain electrode 52 and a source electrode 54 disposed on the semiconductor layer 49. The drain electrode 52 is electrically connected to the pixel electrode 38, and the source electrode 54 is electrically connected to source line 36. The gate line 32 has a cross-over area with the source line 36 and another cross-over area with common line 34. A low-k dielectric layer 56 is provided at least at the cross-over between the source line 36 and the gate line 32 and between the common line 34 and the gate line 32.

The pixel 30 is fabricated with two metal layers: a first metal layer or Metal 1 and a second metal layer or Metal 2. As seen in FIG. 2a which illustrates the process step PEP 1, the first metal layer is disposed on the substrate 20 to provide the first capacitor electrode 62, the gate electrode 42, a first segment of gate line 32 and a second segment of gate line 32, all spaced from each other. As seen in FIG. 2b which illustrates the process step PEP 2, the high-k dielectric layer 44 is disposed on the first capacitor electrode 62 and on the gate electrode 42. An optional insulating layer 46 such as a silicon nitride ($SiN_x$) layer can be disposed on the high-k dielectric layer 44 above the gate electrode 42. Likewise, an optional insulating layer such as layer 46 can also be disposed between the high-k dielectric layer 44 and the second capacitor electrode 64. It is understood that a graytone (or half-tone) mask can be used to form the semiconductor islands over the gate electrode 42 at TFT and to remove the high-k dielectric material on other part of the substrate. As seen in FIG. 2c which illustrates the process step PEP 3, a low-k dielectric layer 56 is disposed and patterned for providing an insulator on the substrate 20 at least between the first capacitor electrode 62 of storage capacitor 60 and the gate electrode 42 of TFT 40, and over the first and second segments of gate line 32. As seen in FIG. 2d which illustrates the process step PEP 4, a second metal layer or Metal 2 is disposed and patterned to form the drain electrode 52 and the source electrode 54 of TFT 40; the source line 36; the second capacitor electrode 64 and the common line 34. As seen in FIG. 2e which illustrates the process step PEP 5, a passivation layer 58 is disposed and patterned to form at least a first via (Via1) to the drain electrode 52 and a second via (Via2) to the first capacitor electrode 62. It is followed that an electrically conducting layer such as indium-tin oxide (ITO) is disposed and patterned to form at least the pixel electrode 38, which is electrically connected to the drain electrode 52 through the first via (Via1) and to the first capacitor electrode 62 through the second via (Via2) to accomplish the layer structure as shown in FIG. 2.

It should be noted that the semiconductor layer 49 may consist of an a-Si layer or be made of polycrystalline silicon, monocrystalline silicon, microcrystalline silicon, nano-crystal silicon, oxide semiconductor material (e.g. indium gallium zinc oxide (IGZO), indium gallium (IGO), indium zinc oxide (IZO), indium tin oxide (ITO), titanium oxide (TiO), zinc oxide (ZnO), indium oxide (InO) or gallium oxide (gallium oxide, GaO)), organic semiconductor material, or other suitable semiconductor materials. The passivation layer 58 can be made of an inorganic insulating material such as silicon oxide, silicon nitride, silicon nitride oxide, or organic insulating material such as colorless/colored resist, polyimide, polyester, benzocyclobutene (BCB), polymethylmethacrylate (PMMA), poly(4-vinylphenol) (PVP), polyvinyl alcohol (PVA), polytetrafluoroethene (PTFE) or other suitable insulating material. The first and second metal layers can be made of aluminum (Al), platinum (Pt), silver (Ag), titanium (Ti), molybdenum (Mo), zinc (Zn), tin (Sn) or other metals or alloys or any suitable conductive material.

The features of the embodiment as shown in Example 1 include the increases in the storage capacitance and the transconductance of TFT by a high-k insulator 44, and the reduction of the cross-over capacitance between the source line 36 and the gate line 32, and between the gate line 32 and the common line 34 by a low-k dielectric layer 56.

It should be noted that, the pixel structure of Example 1 can be fabricated with no more than six masking steps. The first masking step is arranged for patterning the first metal layer into the first capacitor electrode 62, the gate electrode 42 and the gate line 32; the second masking step is arranged for patterning the high-k insulator layer and the semiconductor layer in the TFT; the third masking step is arranged for patterning the low-k dielectric layer; the fourth masking step is arranged for patterning the second metal layer into the drain electrode 52, the source electrode 54, the source line 36, the common line 34 and second capacitor electrode 64; the fifth masking step is arranged for patterning the passivation layer to provide various vias thereon; and the six masking step is arrangement for a conductive layer into the pixel electrode 38 and the third capacitor electrode 68. The second masking step may comprise a gray-tone or half-tone mask process described as follow:

After the mask exposure and photoresist developing, there are different photoresist thicknesses at different areas: the photoresist over the TFT gate region is thicker and the photoresist over the storage capacitor region. After etching the multilayers to expose the glass substrate, there is an oxygen etching step for removing the photoresist over the storage capacitor region, while retaining some photoresist over the TFT gate region. The stack of multilayer over the capacitor region is etched down to the high k insulator. After stripping the remaining photoresist, the stack of multilayer of materials over the gate region is retained. The entire process is performed in one masking step.

EXAMPLE 2

Figure 3:
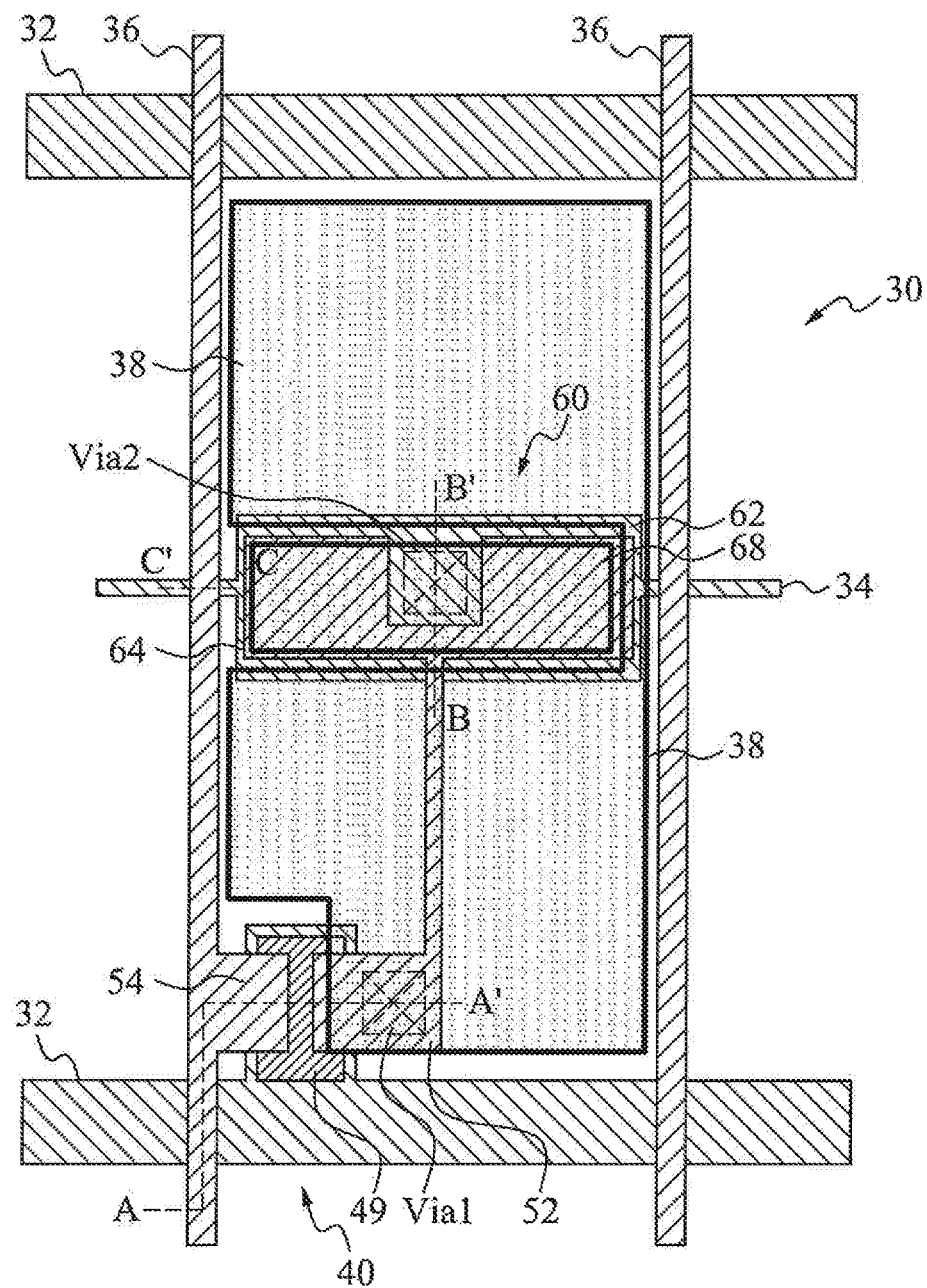
FIG. 3 is a top view of a pixel, according to an embodiment of the present invention.
Figure 4:
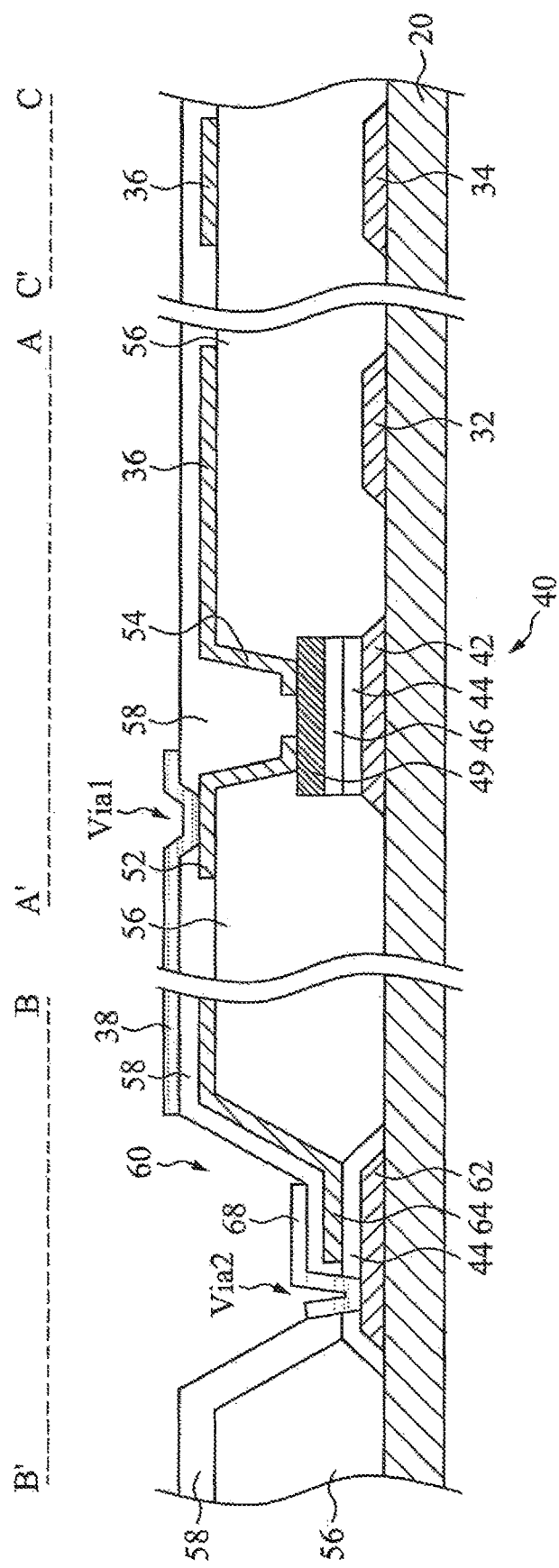
FIG. 4 is a cross-sectional view of the pixel of FIG. 3, along various paths marked as A'-A, B'-B and C'-C.

The embodiment of Example 2 is illustrated in FIG. 3 to FIG. 4e, in which FIG. 3 is a top view of a pixel, FIG. 4 is a cross-sectional view of the pixel of FIG. 3 along various paths marked as A'-A, B'-B and C'-C, and FIGS. 4a-4e show the steps for fabricating the pixel structure in a pixel in an active matrix substrate as shown in FIG. 4.

As seen in FIG. 3, the pixel 30 is defined by an area between two source lines 36 and two gate lines 32. The pixel 30 has a TFT 40, a storage capacitor 60 and a common line 34 substantially parallel to the gate line 32. As seen in FIG. 4, the storage capacitor 60 is shown in the cross-sectional view along path B'-B; the TFT 40 and the cross-over area between the source line 36 and the gate line 32 are shown in the cross-sectional view along path A'-A, and the cross-over area between the source line 36 and the common line 34 is shown in the cross section along path C'-C. The storage capacitor 60 has a first capacitor electrode 62, a second capacitor electrode 64 and a third capacitor electrode 68 which is a part of the common line 34. A high-k dielectric layer 44 is provided between the first capacitor electrode 62 and the second capacitor electrode 64. A passivation layer 58 is provided between the second capacitor electrode 64 and the third capacitor electrode 68. The third capacitor electrode 68 and first capacitor electrode 62 are electrically connected through a via (Via2).

The TFT 40 has a gate electrode 42, a semiconductor layer 49, a high-k dielectric layer 44 and an insulating layer 46 such as a silicon nitride (SiN$_x$) layer as described in Example 1 above. The TFT 40 also has a drain electrode 52 electrically connected to the pixel electrode 38 through a via (Via1) and a source electrode 54 connected to source line 36. The source line 36 has a cross-over area with gate line 32 and another cross-over area with common line 34. A low-k dielectric layer 56 is provided at least at the cross-over areas between the source line 36 and the gate line 32 and between the common line 34 and the source line 36.

The pixel 30 is fabricated with two metal layers: a first metal layer or Metal 1 and a second metal layer or Metal 2. As seen in FIG. 4a which illustrates the process step PEP 1, the first metal layer is disposed on the substrate 20 to provide the first capacitor electrode 62; the gate electrode 42; the gate line 32 and common line 34. As seen in FIG. 4b which illustrates the process step PEP 2, the high-k dielectric layer 44 is disposed on the first capacitor electrode 62 and on the gate electrode 42. An insulating layer 46 such as a silicon nitride (SiN$_x$) layer is disposed on the high-k dielectric layer 44 above the gate electrode 42. A semiconductor layer 49 is provided over the insulating layer 46. As seen in FIG. 4c which illustrates the process step PEP 3, a low-k dielectric layer 56 is patterned for providing an insulator on the substrate 20 at least between the storage capacitor 60 and TFT 40, and over the gate line 32 and common line 34. As seen in FIG. 4d which illustrates the process step PEP 4, the second metal layer or Metal 2 is disposed and patterned to form the drain electrode 52 and the source electrode 54 of TFT 40; the source line 36 and the second capacitor electrode 64 which is electrically connected to the drain electrode 52. As seen in FIG. 4e which illustrates the process step PEP 5, a passivation layer 58 is disposed and patterned to form at least a first via (Via1) to the drain electrode 52 and a second via (Via2) to the first capacitor electrode 62. It is followed that an electrically conducting layer such as indium-tin oxide (ITO) is disposed and patterned to form at least a pixel electrode 38 which is electrically connected to the drain electrode 52 through the first via (Via1), and the third capacitor electrode 68 which is electrically connected to the first capacitor electrode 62 through the second via (Via2) to accomplish the layer structure as shown in FIG. 4.

As with the embodiment of Example 1, the features of the embodiment as shown in Example 2 include the increases in the storage capacitance and the transconductance of TFT by a high-k insulator 44, and the reduction of the cross-over capacitance between the source line 36 and the gate line 32, and between the source line 36 and the common line 34 by a low-k dielectric layer 56.

It should be noted that, the pixel structure of Example 2 can be fabricated with no more than six masking steps. The first masking step is arranged for patterning the first metal layer into the first capacitor electrode 62, the gate electrode 42, the common line 34 and the gate line 32; the second masking step is arranged for patterning the high-k insulator layer and the semiconductor layer in the TFT; the third masking step is arranged for patterning the low-k dielectric layer 56; the fourth masking step is arranged for patterning the second metal layer into the drain electrode 52, the source electrode 54, and the source line 36; the fifth masking step is arranged for patterning the passivation layer to provide various vias thereon; and the six masking step is arrangement for patterning the conductive layer into the pixel electrode 38 and the third capacitor electrode 68.

EXAMPLE 3

Figure 5:
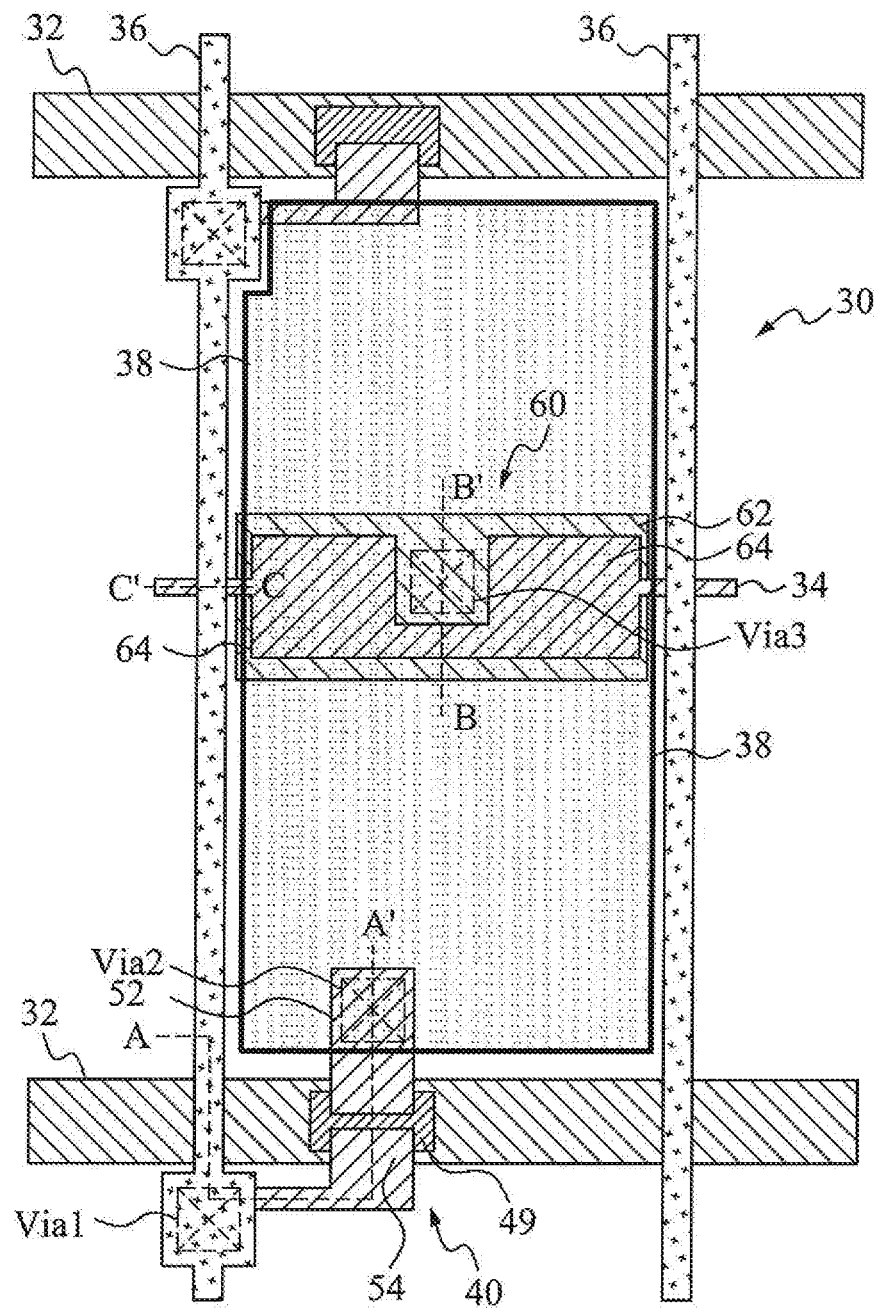
FIG. 5 is a top view of a pixel, according to an embodiment of the present invention.
Figure 6:
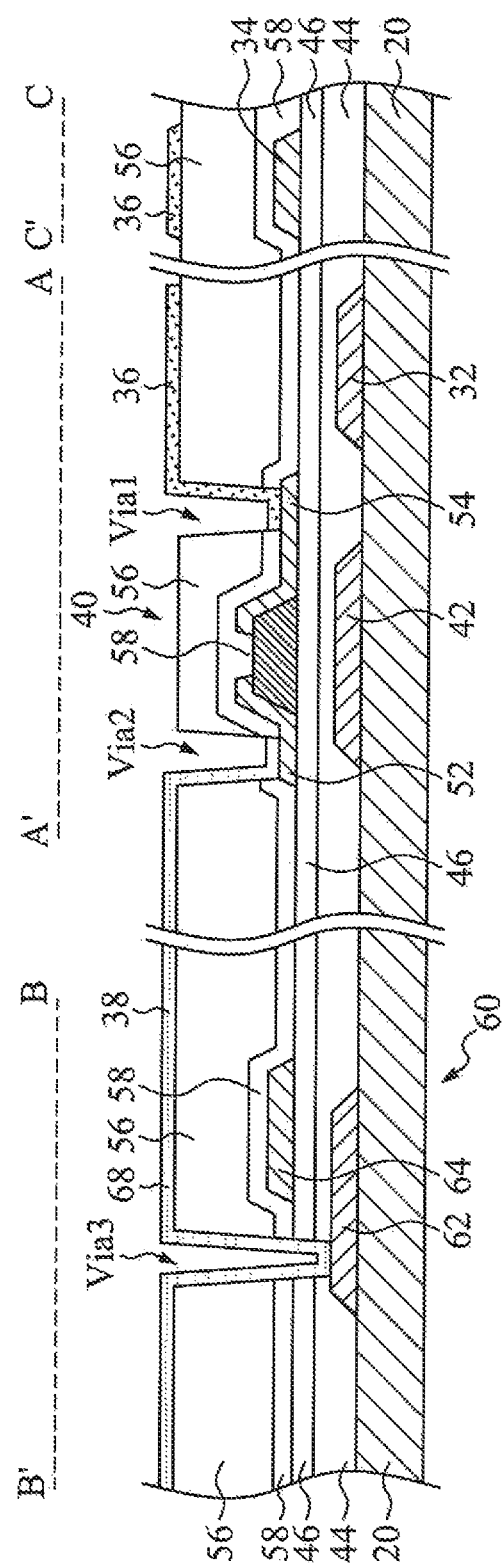
FIG. 6 is a cross-sectional view of the pixel of FIG. 5, along various paths marked as A'-A, B'-B and C'-C.
Figure 6A:
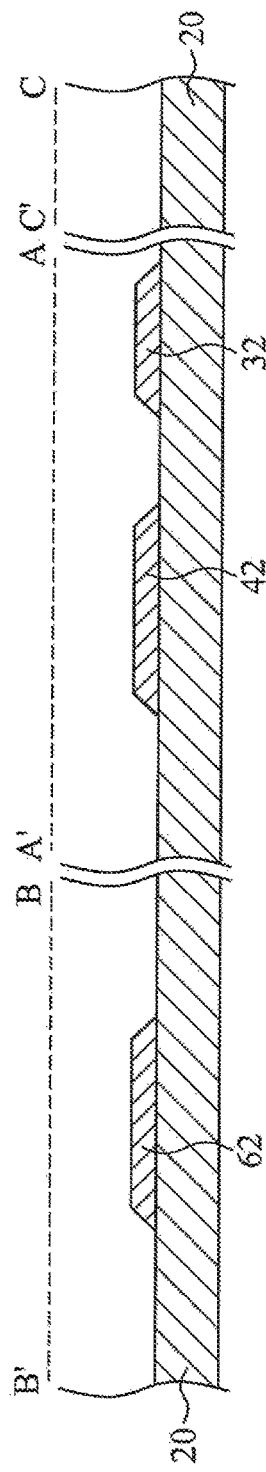
FIGS. 6a-6e show the steps for fabricating an active matrix substrate as shown in FIG. 6.
Figure 6B:
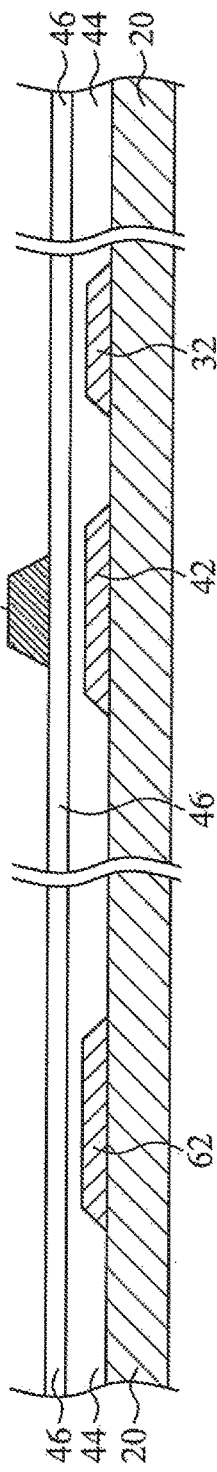
Figure 6C:
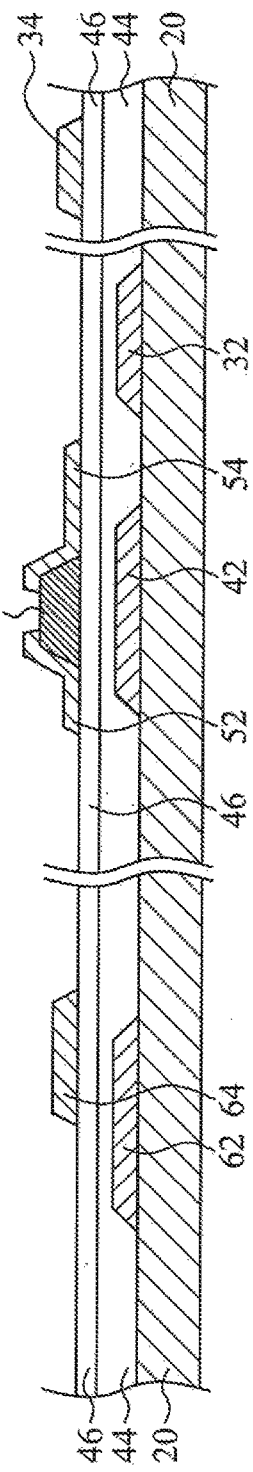
Figure 6D:
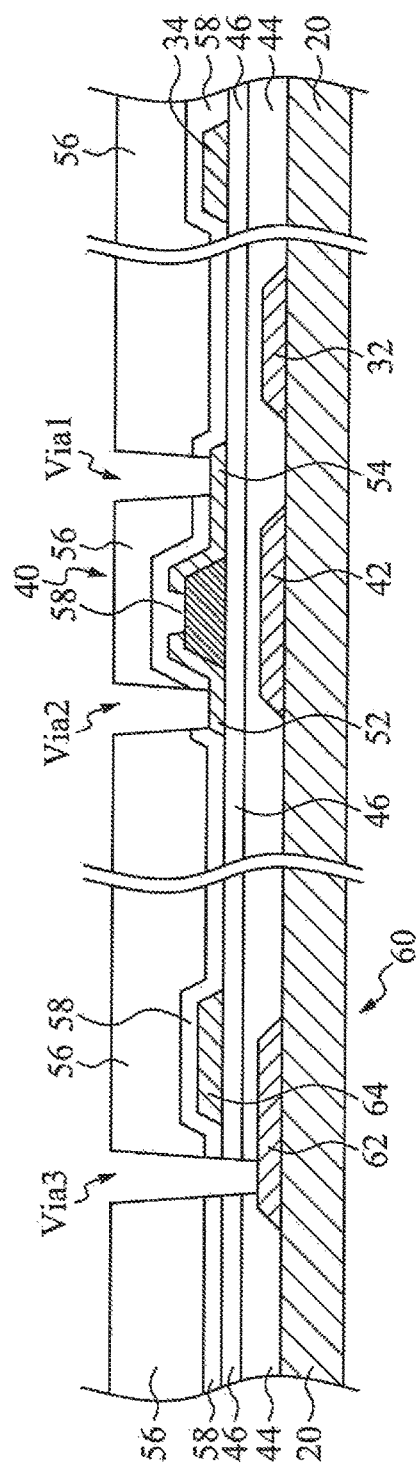
Figure 6E:
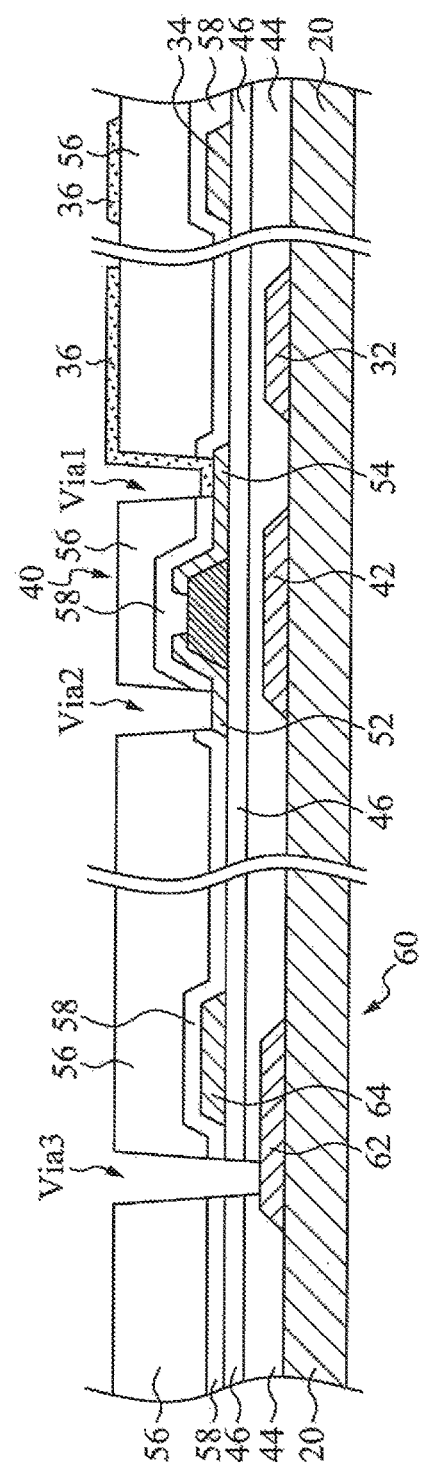

The embodiment of Example 3 is illustrated in FIG. 5 to FIG. 6e, in which FIG. 5 is a top view of a pixel, FIG. 6 is a cross-sectional view of the pixel of FIG. 5 along various paths marked as A'-A, B'-B and C'-C, and FIGS. 6a-6e show the steps for fabricating the pixel structure in a pixel in an active matrix substrate as shown in FIG. 6.

As seen in FIG. 5, the pixel 30 is defined by an area between two source lines 36 and two gate lines 32. The pixel 30 has a common line 34 substantially parallel to the gate line 32. As seen in FIG. 6, the storage capacitor 60 is shown in the cross-sectional view along path B'-B; the TFT 40 and the cross-over area between the source line 36 and the gate line 32 are shown in the cross-sectional view along path A'-A; and the cross-over area between the source line 36 and the common line 34 is shown in the cross-sectional view along path C'-C. The storage capacitor 60 has a second capacitor electrode 64 which is electrically connected to the common line 34.

The TFT 40 has a gate electrode 42, a semiconductor layer 49, a high-k dielectric layer 44 and an insulating layer 46 such as a silicon nitride (SiN$_x$) layer 46 as described in Example 1 above. The TFT 40 also has a drain electrode 52 electrically connected to the pixel electrode 38 through a via (Via2) and a source electrode 54 connected to the source line 36 through another via (Via1). The source line 36 has a cross-over area with the gate line 32 and another cross-over area with the common line 34. A high-k dielectric layer 44 and an insulating layer 46 are disposed as a continuous layer over the first capacitor electrode 62; the gate electrode 42 at TFT 40; the gate line 32 and on part of the substrate. Thus, the high-k dielectric layer 44, along with the insulating layer 46, is provided between the first capacitor electrode 62 and the second capacitor electrode 64, and between the gate electrode 42 and the semiconductor layer 49 at TFT 40. The common line 34 at the cross-over area between the source line 36 and common line 34 is disposed on the insulating layer 46. A passivation layer 58 and a low-k dielectric layer 56 are provided on the second capacitor electrode 64; over the drain electrode 52 and the source electrode 54 at TFT 40; between the source line 36 and insulating layer 46 over the gate line 32; and on the common line 34 at the cross-over area with the source line 36.

The pixel 30 is fabricated with three metal layers: a first metal layer or Metal 1, a second metal layer or Metal 2 and a third metal layer or Metal 3. As seen in FIG. 6a which illustrates the process step PEP 1, the first metal layer is disposed on the substrate to provide the first capacitor electrode 62, the gate electrode 42, and gate line 32. As seen in FIG. 6b which illustrates the process step PEP 2, the continuous high-k dielectric layer 44 is disposed on the substrate 20 covering the first capacitor electrode 62, the gate electrode 42 and the gate line 32. An insulating layer 46 such as a silicon nitride (SiN$_x$) layer is disposed on the high-k dielectric layer 44. A semiconductor layer 49 for TFT 40 is provided over the insulating layer 46. As seen in FIG. 6c which illustrates the process step PEP 3, the second metal layer is disposed and patterned to form the second capacitor electrode 64; the drain electrode 52 and the source electrode 54 on the semiconductor layer 49 at TFT 40; and the common line 34 on the insulating layer 46. As seen in FIG. 6d which illustrates the process step PEP 4, a passivation layer 58 is disposed on the insulating layer 46, covering the second capacitor electrode 64, the drain electrode 52 and the source electrode 54 at TFT 40 and the common line 34. A low-k dielectric layer 56 is disposed on the passivation layer 58. The passivation layer 58 and the low-k dielectric layer 56 are then patterned to form a first via (Via1) to the source electrode 54, a second via (Via2) to the drain electrode 52 and a third via (Via3) to the first capacitor electrode 62. As seen in FIG. 6e which illustrates the process step PEP 5, a third metal layer is disposed and patterned to form the source line 36 which is electrically connected to the source electrode 54 through the first via (Via1). The source line 36 and the common line 34 have a cross-over area. It is followed that an electrically conducting layer such as indium-tin oxide (ITO) is disposed and patterned to form a pixel electrode 38 which is electrically connected to the drain electrode 52 through the second via (Via2), and also electrically connected to the first capacitor electrode 62 through the third via (Via3) to accomplish the layer structure as shown in FIG. 6.

As with the embodiment of Example 1, the features of the embodiment as shown in Example 3 include the increases in the storage capacitance and the transconductance of TFT by a high-k insulator 44, and the reduction of the cross-over capacitance between the source line 36 and the gate line 32, and between the source line 36 and the common line 34 by a low-k dielectric layer 56.

It should be noted that, the pixel structure of Example 3 can be fabricated with no more than six masking steps. The first masking step is arranged for patterning the first metal layer into the first capacitor electrode 62, the gate electrode 42, and the gate line 32; the second masking step is arranged for patterning the semiconductor layer in the TFT; the third masking step is arranged for patterning the second metal layer into the second capacitor electrode 64, the source/drain electrodes 54/52 of the TFT and the common line 34; the fourth masking step is arranged for patterning the passivation layer to provide various vias thereon; the fifth masking step is arranged for patterning the third metal layer into a source line 36; and the six masking step is arrangement for patterning the conductive layer into the pixel electrode 38 and the third capacitor electrode 68.

EXAMPLE 4

Figure 7:
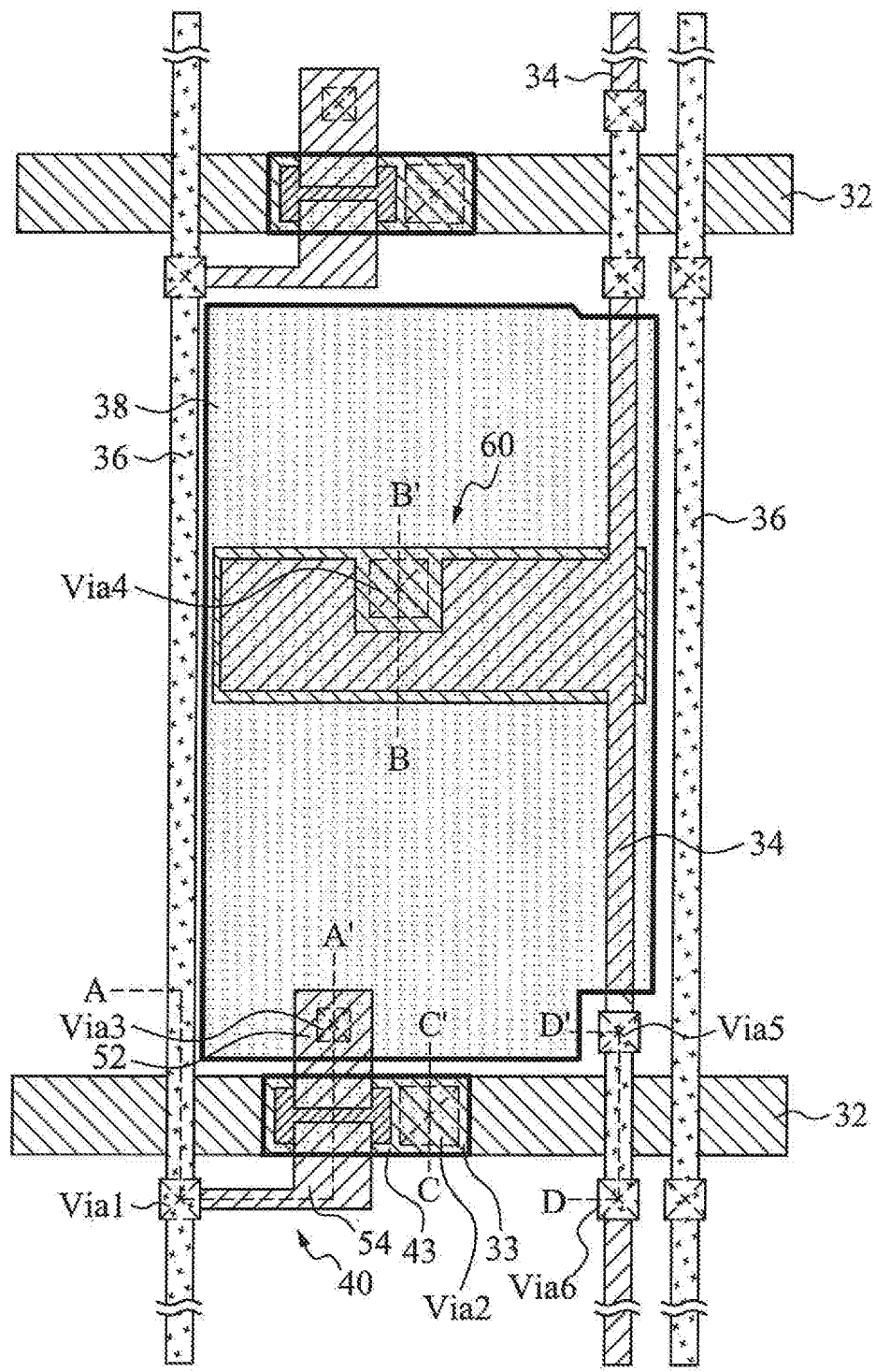
FIG. 7 is a top view of a pixel, according to an embodiment of the present invention.
Figure 8:
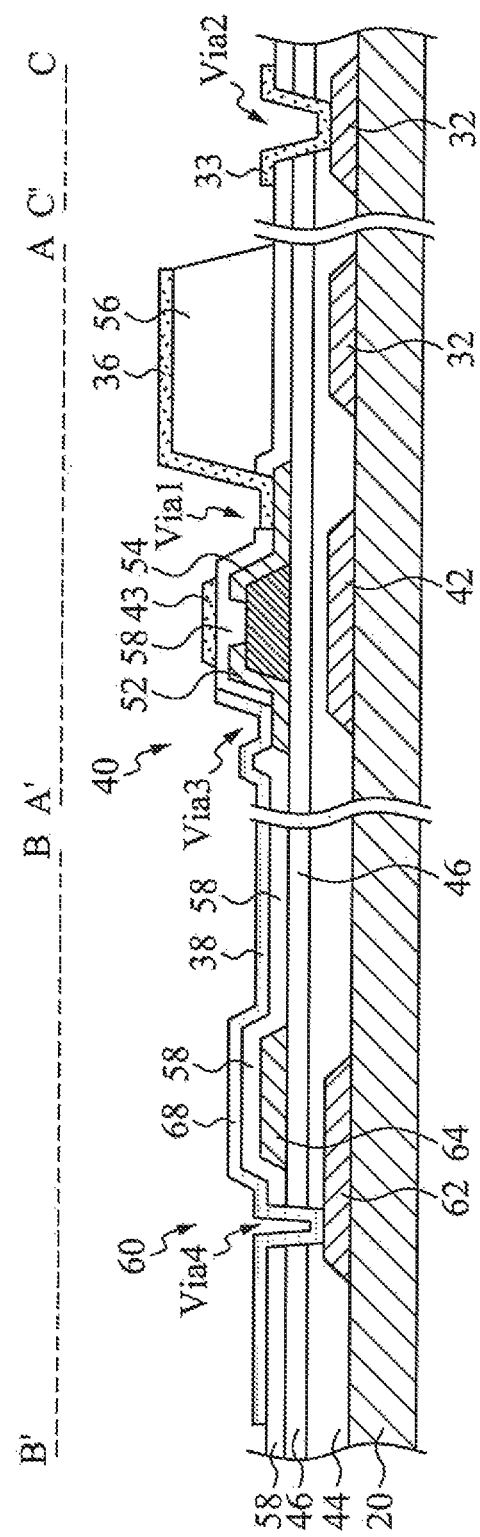
FIG. 8 is a cross-sectional view of the pixel of FIG. 7, along various paths marked as A'-A, B'-B, C'-C and D'-D.

The embodiment of Example 4 is illustrated in FIG. 7 to FIG. 8e, in which FIG. 7 is a top view of a pixel, FIG. 8 is a cross-sectional view of the pixel of FIG. 7 along various paths marked as A'-A, B'-B, C'-C and D'-D, and FIGS. 8a-8g show the steps for fabricating the pixel structure in a pixel in an active matrix substrate as shown in FIG. 8.

As seen in FIG. 7, the pixel 30 is defined by an area between two source lines 36 and two gate lines 32. The pixel 30 has a TFT 40, a storage capacitor 60 and a common line 34 substantially parallel to the source line 36. As seen in FIG. 8, the storage capacitor 60 is shown in the cross-sectional view along path B'-B; the TFT 40 and the cross-over area between the source line 36 and the gate line 32 are shown in the cross-sectional view along path A'-A; the cross-over area between the gate line 32 and the common line 34 is shown in the cross-sectional view along path D'-D; and the via for electrically connecting a second gate electrode 43 to the gate line 32 is shown in the cross-sectional view along path C'-C. The storage capacitor 60 has a first capacitor electrode 62, a second capacitor electrode 64 and a third capacitor electrode 68 which is a part of the pixel electrode 38.

The TFT 40 has a gate electrode 42, a semiconductor layer 49, a high-k dielectric layer 44 and an insulating layer 46 as described in Example 1 above. The TFT 40 also has a drain electrode 52 electrically connected to the pixel electrode 38 through a via (Via3) and a source electrode 54 connected to source line 36 through another via (Via1). The gate line 32 has a cross-over area with source line 36 and another cross-over area with common line 34. A high-k dielectric layer 44 and an insulating layer 46 are disposed as a continuous layer over the first capacitor electrode 62, the gate electrode 42 at TFT 40, the gate line 32 and on part of the substrate 20. Thus, the high-k dielectric layer 44, along with the insulating layer 46, is provided between the first capacitor electrode 62 and the second capacitor electrode 64; between the gate electrode 42 and the semiconductor layer 49 at TFT 40; and between the cross-over area between the source line 36 and a segment of a gate line 32. A passivation layer 58 is provided on the second capacitor electrode 64; over the drain electrode 52 and the source electrode 54 at TFT 40; between the source line 36 and insulating layer 46 over the gate line 32.

Figure 8A:
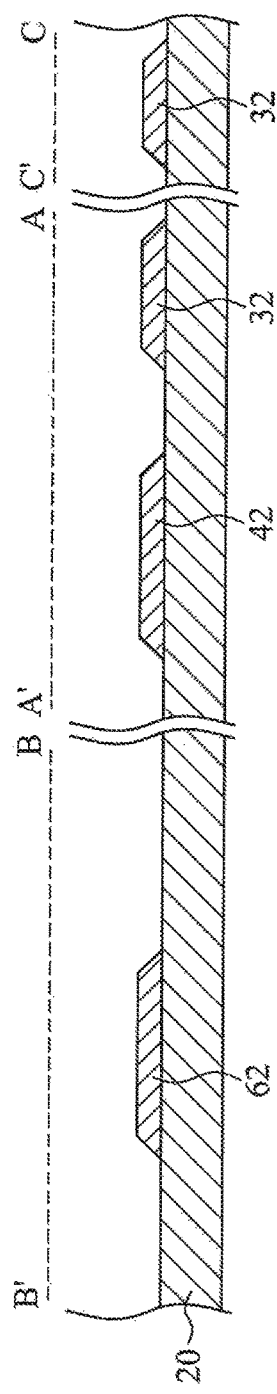
Figure 8B:
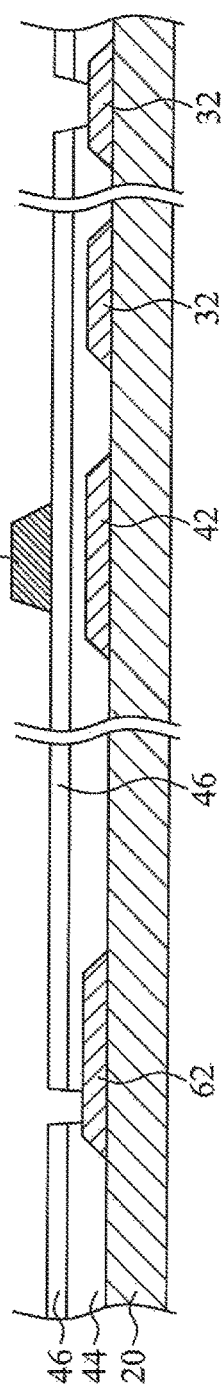
Figure 8C:
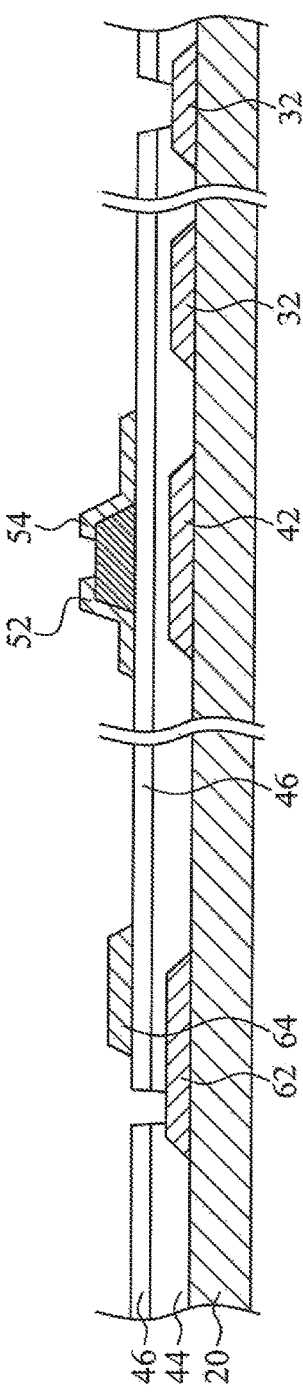
Figure 8F:
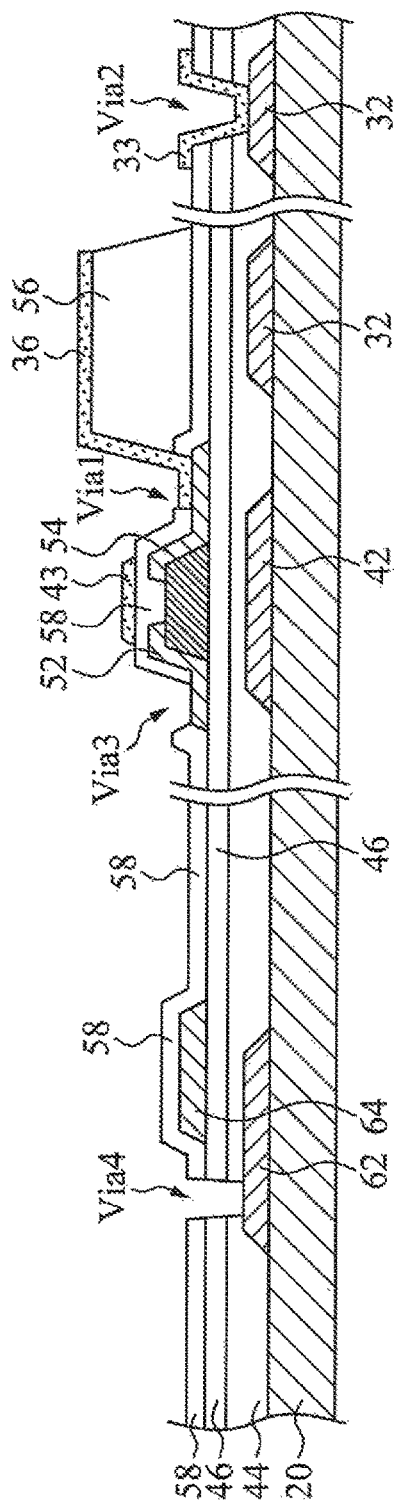
Figure 8G:
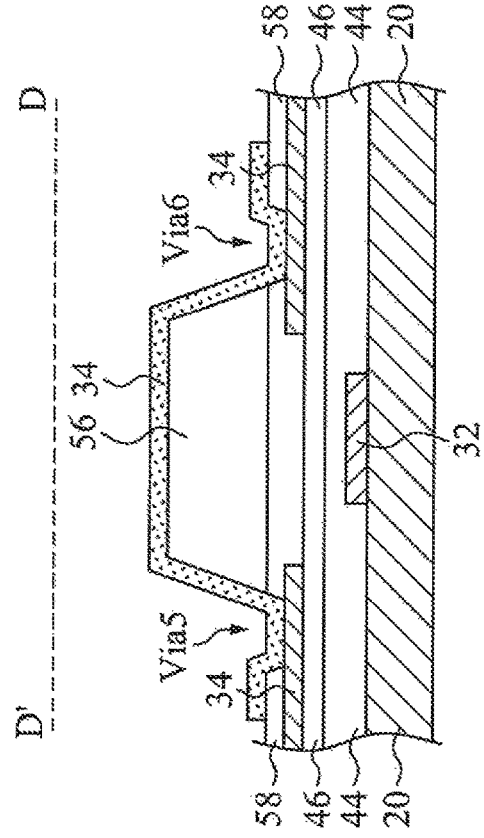

The pixel 30 is fabricated with three metal layers: a first metal layer or Metal 1, a second metal layer or Metal 2 and a third metal layer or Metal 3. As seen in FIG. 8a which illustrates the process step PEP 1, the first metal layer is disposed on the substrate 20 to provide the first capacitor electrode 62, the gate electrode 42, and gate line 32. As seen in FIG. 8b which illustrates the process step PEP 2, the continuous high-k dielectric layer 44 is disposed on the substrate covering the first capacitor electrode 62, the gate electrode 42 and the gate line 32. An insulating layer 46 such as a silicon nitride ($SiN_x$) layer is disposed on the high-k dielectric layer 44. A semiconductor layer 49 for TFT 40 is provided over the insulating layer 46. As seen in FIG. 8c which illustrates the process step PEP 3, a second metal layer is disposed and patterned to form the second capacitor electrode 64, and the drain electrode 52 and the source electrode 54 on the semiconductor layer 49 at TFT 40. As seen in FIG. 8d which illustrates the process step PEP 4, a passivation layer 58 is disposed on the insulating layer 46, covering the second capacitor electrode 64, the drain electrode 52 and source electrode 54 at TFT 40. The passivation layer 58 is then patterned to form a first via (Via1) to the source electrode 54 and a third via (Via3) to the drain electrode 52. The passivation layer 58, together with the high-k dielectric layer 44 and the insulating layer 46, is patterned to form a second via (Via2) to a first segment of the gate line 32 and a fourth via (Via4) to the first capacitor electrode 62. As seen in FIG. 8e which illustrates the process step PEP 5, a low-k dielectric layer 56 is disposed and patterned to form an insulator layer on the passivation layer 58 over a second segment of the gate line 32. As seen in FIG. 8f which illustrates the process step PEP 6, a third metal layer is disposed and patterned to form the source line 36; and a second gate electrode 43 at TFT 40, wherein the source line 36 is electrically connected to the source electrode 54 through the first via (Via1), and the second gate electrode 43 is electrically connected to a second gate line 33 which is electrically connected to the first segment of the gate line 32 through the second via (Via2). The source line 36 and the second segment of gate line 32 have a cross-over area. It is followed that an electrically conducting layer such as indium-tin oxide (ITO) is disposed and patterned to form a pixel electrode 38 which is electrically connected to the drain electrode 52 through the third via (Via3), and also electrically connected to the first capacitor electrode 62 through the fourth via (Via4). As seen in FIG. 8g, the common line 34 must cross over the gate line 32. In order to reduce the cross over capacitance, the common line 34 disposed on the insulating layer 46 is disrupted near the gate line 32 as seen in the cross-sectional view along path D'-D. As the passivation layer 58 is disposed over the common line 32 in PEP 4, the passivation layer 58 is also patterned to form a fifth via (Via5) and a sixth via (Via6) to the disrupted segments of the common line 34. A part of the third metal disposed in PEP 6 is used to provide a bridge to electrically connect the disrupted segments of the common line 34. As seen in FIG. 8g, a thick layer of low-k dielectric layer 56 is provided at the cross over between the bridged common line and the gate line 32.

As with the embodiment of Example 1, the features of the embodiment as shown in Example 4 include the increases in the storage capacitance and the transconductance of TFT by a high-k insulator 44, and the reduction of the cross-over capacitance between the source line 36 and the gate line 32, and between the source line 36 and the common line 34 by a low-k dielectric layer 56. Furthermore, the source line 36 from the third metal layer is electrically connected to the source electrode made from the second metal layer through a via so as to reduce the cross-over capacitance.

It should be noted that, the pixel structure of Example 4 can be fabricated with no more than seven masking steps. The first masking step is arranged for patterning the first metal layer into the first capacitor electrode 62, the gate electrode 42, and the gate line 32; the second masking step is arranged for patterning the semiconductor layer in the TFT; the third masking step is arranged for patterning the second metal layer into the second capacitor electrode 64, the source/drain electrodes 54/52 of the TFT and the common line 34; the fourth masking step is arranged for patterning the passivation layer to provide vias thereon; the fifth masking step is arranged for patterning the low-k insulator into an low-k dielectric layer 56 at the cross-over area between the source line 36 and the gate line 32; the sixth masking step is arranged for patterning the third metal layer into a second gate electrode 43, the second gate line 33 and the source line 36; and the seventh masking step is arrangement for patterning the conductive layer into the pixel electrode 38 and the third capacitor electrode 68.

EXAMPLE 5

Figure 9:
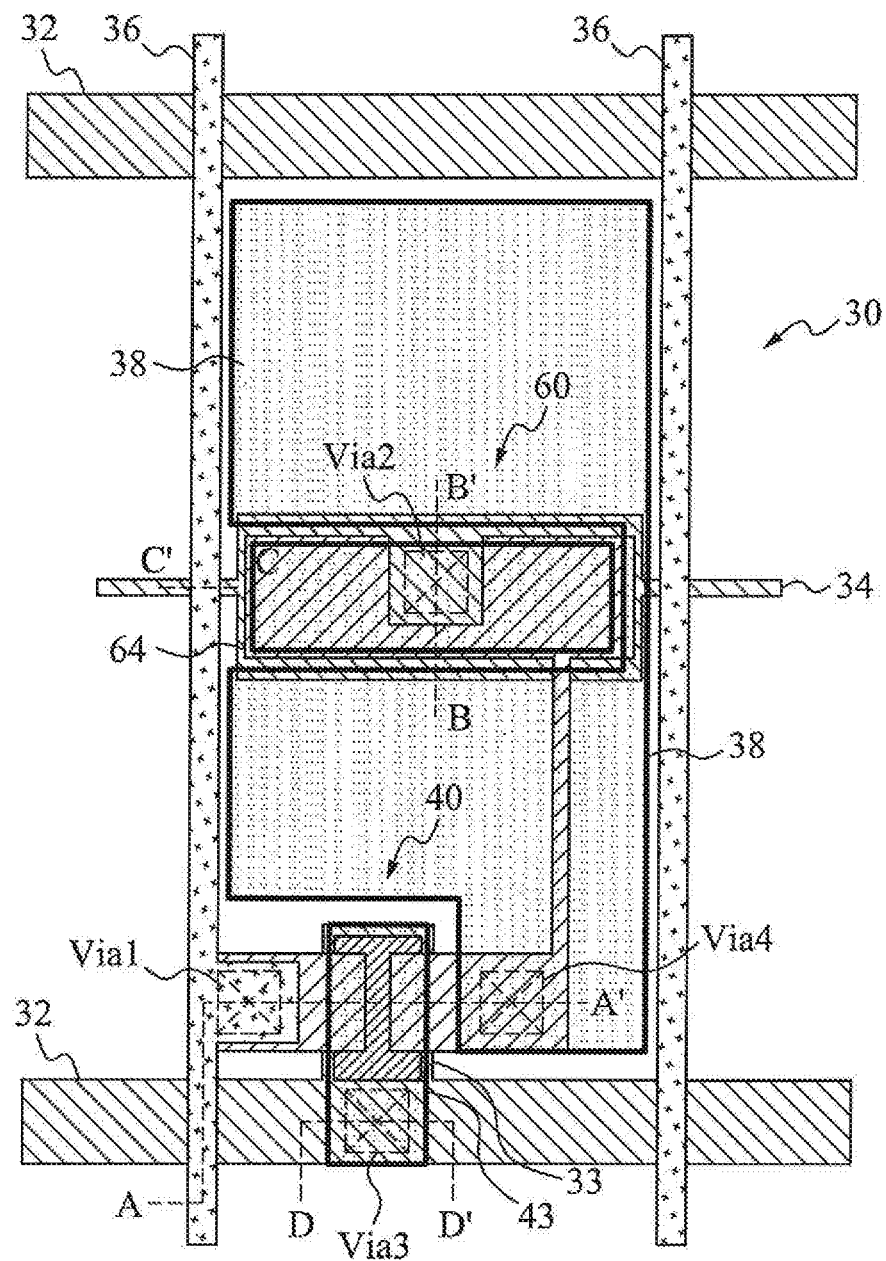
FIG. 9 is a top view of a pixel, according to an embodiment of the present invention.
Figure 10:
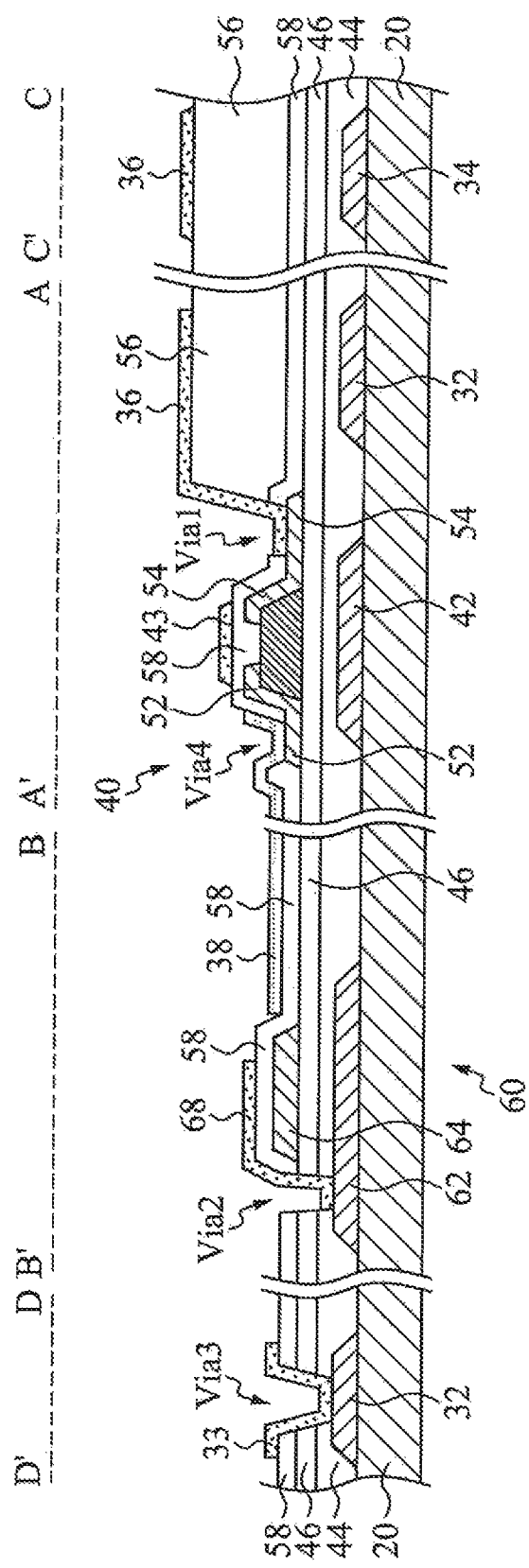
FIG. 10 is a cross-sectional view of the pixel of FIG. 9, along various paths marked as A'-A, B'-B, C'-C and D'-D.

The embodiment of Example 5 is illustrated in FIG. 9 to FIG. 10f, in which FIG. 9 is a top view of a pixel, FIG. 10 is a cross-sectional view of the pixel of FIG. 9 along various paths marked as A'-A, B'-B, C'-C and D'-D, and FIGS. 10a-10f show the steps for fabricating a pixel in an active matrix substrate as shown in FIG. 10.

As seen in FIG. 9, the pixel 30 is defined by an area between two source lines 36 and two gate lines 32. The pixel 30 has a TFT 40, a storage capacitor 60, and a common line 34 substantially parallel to the gate line 32. As seen in FIG. 10, the storage capacitor 60 is shown in the cross-sectional view along path B'-B; the TFT 40 and the cross-over area between the source line 36 and the gate line 32 are shown in the cross-sectional view along path A'-A; the cross-over area between the source line 36 and the common line 34 is shown in the cross-sectional view along path C'-C; and a connection between a second gate electrode 43 and the gate line 32 is shown in the cross-sectional view along path D'-D. The storage capacitor 60 has a second capacitor electrode 64 which is electrically connected to the drain electrode 52 of TFT 40, and a third capacitor electrode 68 electrically connected to the first capacitor electrode 62 through a via (Via2) and electrically connected to the common line 36.

The TFT 40 has a gate electrode 42, a semiconductor layer 49, a high-k dielectric layer 44 and an insulating layer 46 as described in Example 1 above. The drain electrode 52 of TFT 40 is electrically connected to the pixel electrode 38 through a via (Via4) and the source electrode 54 of TFT 40 is electrically connected to a source line 36 through another via (Via1). The source line 36 has a cross-over area with the gate line 32 and another cross-over area with the common line 34. A high-k dielectric layer 44 and an insulating layer 46 are disposed as a continuous layer over the first capacitor electrode 62, the gate electrode 42 at TFT 40, the gate line 32 and on part of the substrate 20. Thus, the high-k dielectric layer 44, along with the insulating layer 46, is provided between the first capacitor electrode 62 and the second capacitor electrode 64; between the gate electrode 42 and the semiconductor layer 49 at TFT 40; at the cross-over area between the source line 36 and the gate line 32; and at the cross-over area between the source line 36 and the common line 34. A passivation layer 58 is provided on the second capacitor electrode 64; over the drain electrode 52 and the source electrode 54 at TFT 40; between the source line 36 and insulating layer 46 over the gate line 32 and the common line 34.

Figure 10C:
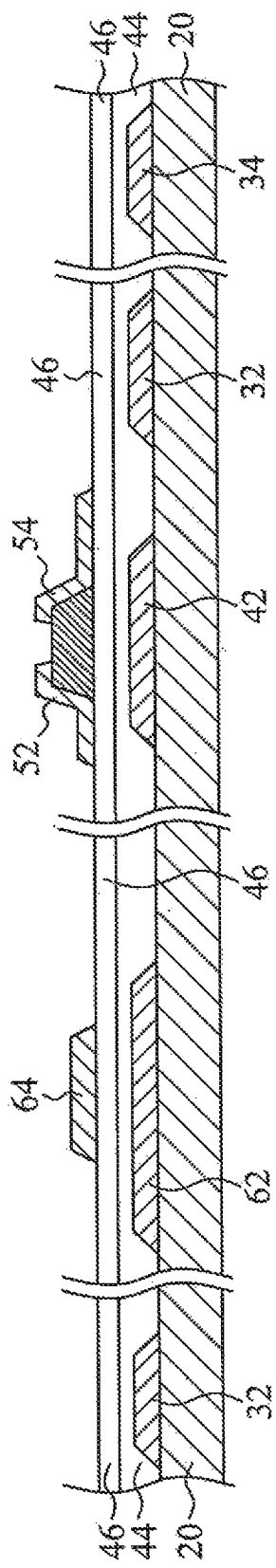
Figure 10D:
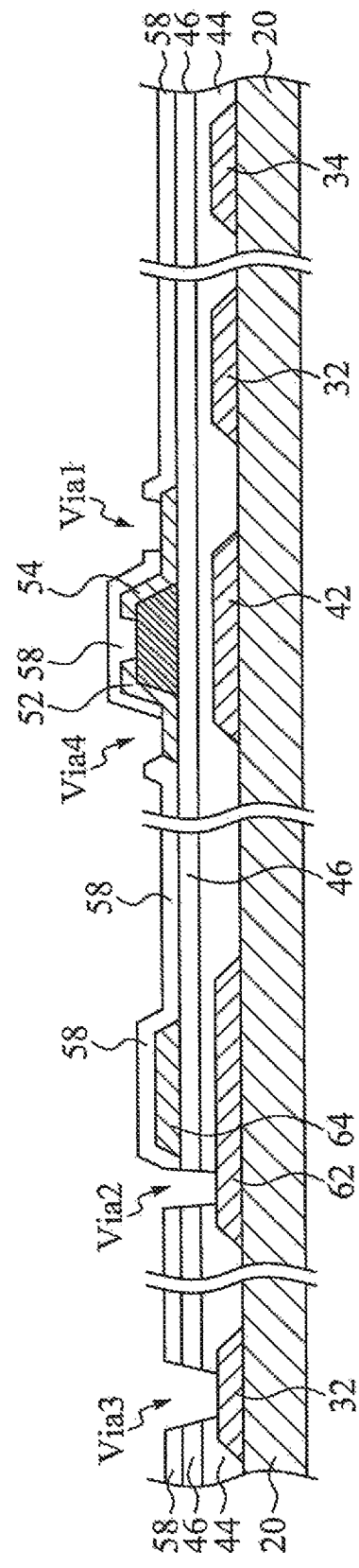

The pixel 30 is fabricated with three metal layers: a first metal layer or Metal 1, a second metal layer or Metal 2 and a third metal layer or Metal 3. As seen in FIG. 10a which illustrates the process step PEP 1, the first metal layer is disposed on the substrate 20 to provide the first capacitor electrode 62, the gate electrode 42, the common line 34 and gate line 32. As seen in FIG. 10b which illustrates the process step PEP 2, the continuous high-k dielectric layer 44 is disposed on the substrate, covering the first capacitor electrode 62; the gate electrode 42; the common line 34 and the gate line 32. An insulating layer 46 such as a silicon nitride (SiN$_x$) layer is disposed on the high-k dielectric layer 44. A semiconductor layer 49 for TFT 40 is provided over the insulating layer 46. As seen in FIG. 10c which illustrates the process step PEP 3, the second metal layer is disposed and patterned to form the second capacitor electrode 64, the drain electrode 52 and the source electrode 54 on the semiconductor layer 49 at TFT 40. As seen in FIG. 10d which illustrates the process step PEP 4, a passivation layer 58 is disposed on the insulating layer 46, covering the second capacitor electrode 64, and the drain electrode 52 and source electrode 54 at TFT 40. The passivation layer 58 is then patterned to form a first via (Via1) to the source electrode 54, a fourth via (Via4) to the drain electrode 52, a second via (Via2) to the first capacitor electrode 62 and a third via (Via3) to a first segment of gate line 32. As seen in FIG. 10e which illustrates the process step PEP 5, a low-k dielectric layer 56 is disposed and patterned to form an insulator layer on the passivation layer 58 over the common line 34 and a second segment of the gate line 32. As seen in FIG. 10f which illustrates the process step PEP 6, the third metal layer is disposed and patterned to form the source line 36; a second gate electrode 43 at TFT 40, and the third capacitor electrode 68, wherein the third capacitor electrode 68 is electrically connected to the first capacitor electrode 62 through the second via (Via2), the source line 36 is electrically connected to the source electrode 54 through the first via (Via1), and the second gate electrode 43 is electrically connected to a second gate line 33, which is electrically connected to the first segment of the gate line 32 through the third via (Via3). The source line 36 has a cross-over area with the second segment of the gate line 32 and another cross-over area with the common line 34.

As with the embodiment of Example 1, the features of the embodiment as shown in Example 5 include the increases in the storage capacitance and the transconductance of TFT by a high-k insulator 44, and the reduction of the cross-over capacitance between the source line 36 and the gate line 32, and between the source line 36 and the common line 34 by a low-k dielectric layer 56. Furthermore, the source line 36 from the third metal layer is electrically connected to the source electrode 54 made from the second metal layer through a via so as to reduce the cross-over capacitance.

It should be noted that, the pixel structure of Example 5 can be fabricated with no more than seven masking steps. The first masking step is arranged for patterning the first metal layer into the first capacitor electrode 62, the gate electrode 42, the common line 34 and the gate line 32; the second masking step is arranged for patterning the semiconductor layer 49 in the TFT; the third masking step is arranged for patterning the second metal layer into the second capacitor electrode 64, the source/drain electrodes 54/52 of the TFT; the fourth masking step is arranged for patterning the passivation layer to provide various vias thereon; the fifth masking step is arranged for patterning the low-k insulator into a low-k dielectric layer 56 at the cross-over area between the source line 36 and the common line 34 and at the cross-over area between the source line 36 and the gate line 32; the sixth masking step is arranged for patterning the third metal layer into the second gate electrode 43, the second gate line 33, the third capacitor electrode 68 and the source line 36; and the seventh masking step is arrangement for pattering the conductive layer into the pixel electrode 38.

EXAMPLE 6

The embodiment of Example 6 uses a double-metal line (Metal 2 and Metal 3) as a source line to reduce the source line resistance, and uses another double-metal line (Metal 1 and Metal 3) as a gate line to reduce the gate line resistance.

Figure 11:
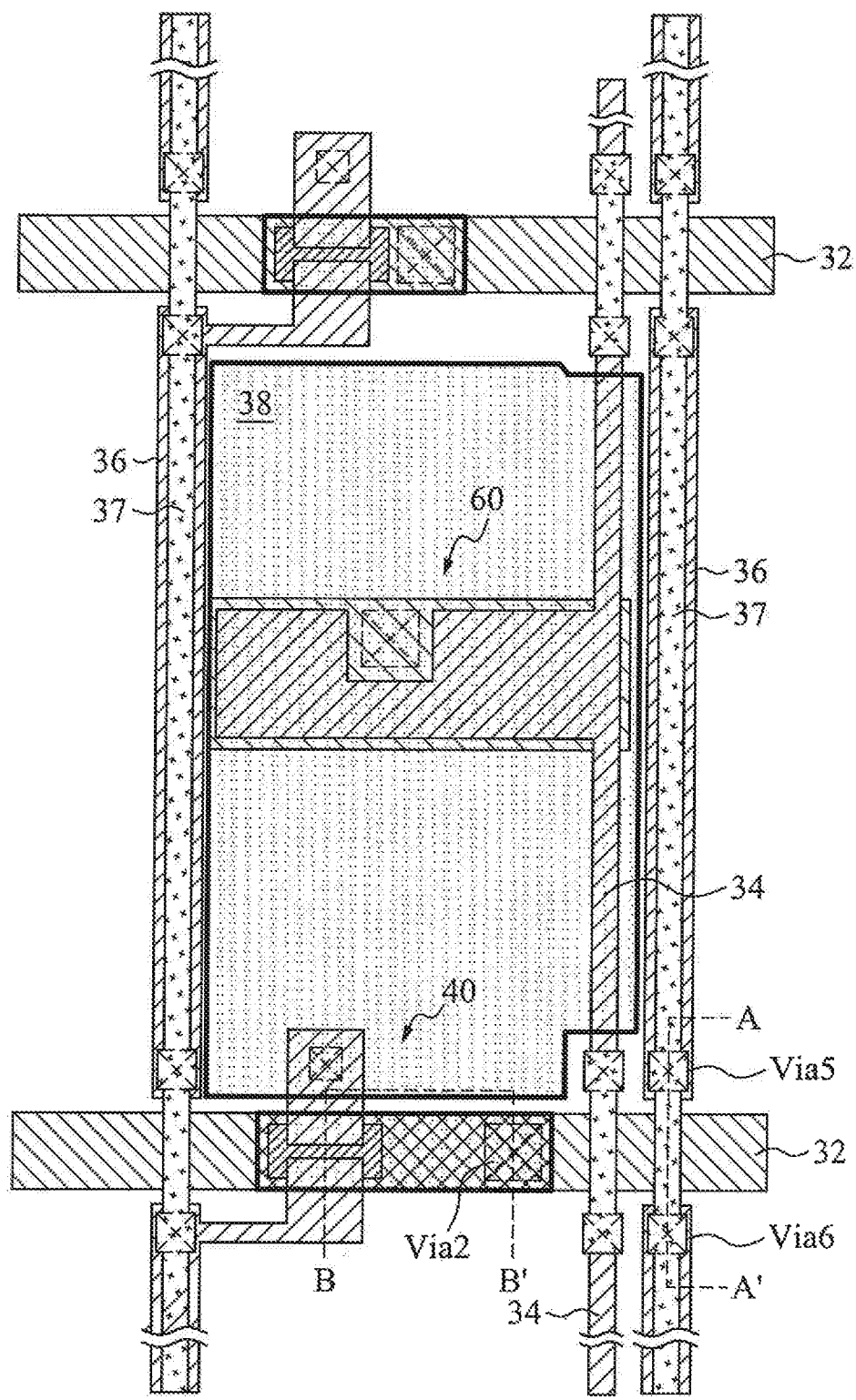
FIG. 11 is a top view of a pixel, according to an embodiment of the present invention.
Figure 12:
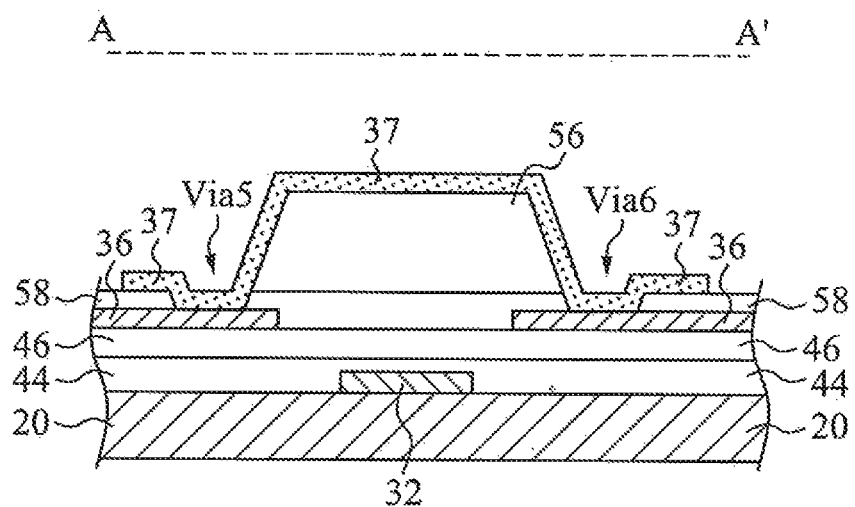
FIG. 12 is a cross-sectional view of the pixel of FIG. 11 along path A-A'.
Figure 13:
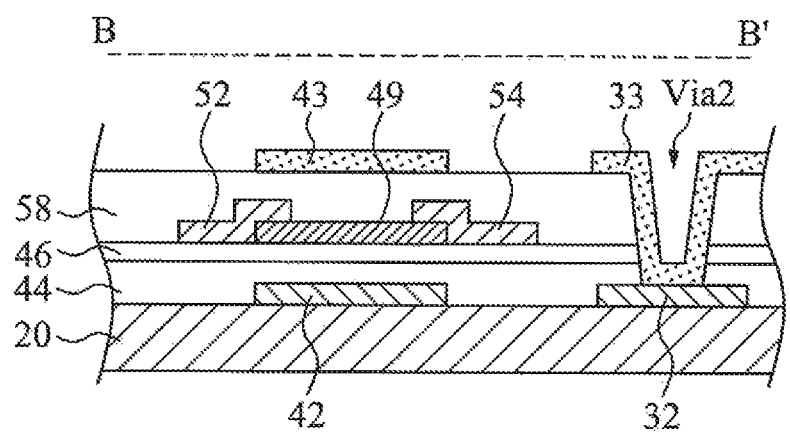
FIG. 13 is a cross-sectional view of the pixel of FIG. 11 along path B-B'.

The embodiment of Example 6 is illustrated in FIGS. 11-13 in which FIG. 11 is a top view of a pixel, FIG. 12 is a cross-sectional view of the pixel of FIG. 11 along path A'-A, and FIG. 13 is a cross-sectional view of FIG. 11 along path B'-B. As seen in FIG. 11, the pixel 30 is defined by an area bound by a source line 36 and second source line 37 and a gate line 32 and second gate line 33. The pixel 30 has a common line 34 substantially parallel to the source lines 32. As with the embodiment of Example 4 as shown in FIGS. 7 and 8, the gate line 32 and the gate electrode 42 are made from a first metal layer (Metal 1) disposed on the substrate. The composite source line has an upper portion (second source line 37) made from a third metal layer (Metal 3) and a lower portion (source line 36) made from a second metal layer (Metal 2), separated by a passivation layer 58. As seen in FIG. 12, at the cross-over area between the second source line 37 and the gate line 32, the source line 36 is disrupted; a low-k dielectric layer 56 is disposed on the passivation layer 58; and the passivation layer 58 is patterned to provide two vias so as to allow a bridge made from the third metal layer to electrically connect the disrupted portion of the source line 36. The low-k dielectric layer 56 at the cross-over area is arranged to reduce the cross-over capacitance. As seen in FIG. 13, a second gate electrode 43 and a second gate line 33 made from the third metal layer is electrically connected to the gate line 32 through a via made through the passivation layer 58 and a high-k dielectric layer 44.

As with the embodiment of Example 1, the features of the embodiment as shown in Example 6 include the increases in the storage capacitance and the transconductance of TFT by a high-k insulator 44, and the reduction of the cross-over capacitance between the source line 36 and the gate line 32, and between the gate line 32 and the common line 34 by a low-k dielectric layer 56. Furthermore, the second source line 37 from the third metal layer is electrically connected to the source line 36 made from the second metal layer through a via so as to reduce the source line resistance.

In summary, in the pixel structure according to various embodiment of the present invention, the switching element of TFT 40 has a gate electrode disposed on the substrate, a semiconductor layer disposed on the gate electrode, a drain electrode and a source electrode disposed on the semiconductor layer and a high-k dielectric material is provided between the gate electrode and the semiconductor layer to increase the transconductance of the TFT. The storage capacitor 60 has at least a first capacitor electrode, a second capacitor electrode and a third capacitor electrode, and the first capacitor electrode disposed on the substrate, wherein the high-k dielectric material is also provided between the first capacitor electrode and the second capacitor electrode in the storage capacitor so as to increase the storage capacitance. The high-k dielectric material has a dielectric constant higher than 8. A third capacitor electrode provided on the storage capacitor further increases the storage capacitance of the storage capacitor.

In a pixel where a pixel electrode is electrically connected to the drain electrode; a source line is electrically connected to the source electrode; a gate line is electrically connected to the gate electrode; and a common line is electrically connected to the second capacitor electrode of the storage capacitor or to the first or third capacitor electrode. A low-k dielectric layer is provided at the cross-over between the source line and the gate line, between the common line and the gate line, and between the source line and the common line so as to reduce the cross-over capacitance.

The fabrication of the pixel structure can be made with two metal layers or three metal layers. When the fabrication has three metal layers, a dual-gate structure can be realized so as to further increase the TFT transconductance, and a double-metal source line can reduce the source line and gate line resistance.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A pixel structure for use in a display panel having a substrate, the pixel structure comprising:
   a switching element comprising:
   a gate electrode disposed on the substrate,
   a first dielectric layer disposed on the gate electrode,
   a semiconductor layer disposed on the first dielectric layer, and
   a drain electrode and a source electrode disposed on the semiconductor layer, the first dielectric layer having a dielectric constant equal to or higher than 8;
   a storage capacitor comprising a first capacitor electrode, a second capacitor electrode, a third capacitor electrode, a passivation layer disposed between the second capacitor electrode and the third capacitor electrode, and a second dielectric layer disposed between the first capacitor electrode and the second capacitor electrode, the second dielectric layer having a dielectric constant equal to or higher than 8;
   a first signal line electrically connected to the source electrode;
   a second signal line electrically connected to the gate electrode; and
   a common line electrically connected to the storage capacitor, wherein two of the first signal line, the second signal line and the common line are arranged to cross over each other over a third dielectric layer at a cross-over area, the third dielectric layer having a dielectric constant equal to or lower than 5.

2. The pixel structure according to claim 1, wherein the switching element further comprises an insulating layer disposed between the first dielectric layer and the semiconductor layer.

3. The pixel structure according to claim 2, wherein the switching element further comprises:
   a further passivation layer disposed on the drain electrode and the source electrode, and
   a second gate electrode disposed on the further passivation layer, the second gate electrode electrically connected to the gate electrode through a via.

4. The pixel structure according to claim 1, wherein the first signal line and the second signal line are arranged to cross over each other at a first cross-over area, and the common line and the second signal line are arranged to cross over each other at a second cross-over area, and wherein the third dielectric layer is disposed between the first signal line and the second signal line at least at the first cross-over area and between the common line and the second signal line at least at the second cross-over area.

5. The pixel structure according to claim 1, wherein the first signal line and the second signal line are arranged to cross over each other at a first cross-over area, and the common line and the first signal line are arranged to cross over each other at a second cross-over area, and wherein the third dielectric layer is disposed between the first signal line and the second signal line at least at the first cross-over area and between the common line and the first signal line at least at the second cross-over area.

6. The pixel structure according to claim 1, further comprising:
a fourth dielectric layer disposed on the second signal line; and
a further passivation layer disposed on the fourth dielectric layer and on the common line, the fourth dielectric layer having a dielectric constant equal to or higher than 8, wherein the first signal line and the second signal line are arranged to cross over each other at a first cross-over area, and the common line and the first signal line are arranged to cross over each other at a second cross-over area, and wherein
the third dielectric layer is disposed on the further passivation layer between the first signal line and the second signal line at least at the first cross-over area, and on the further passivation layer between the common line and the first signal line at least at the second cross-over area.

7. The pixel structure according to claim 1, further comprising:
a fourth dielectric layer disposed on the second signal line and the common line; and
a further passivation layer disposed on the fourth dielectric layer, the fourth dielectric layer having a dielectric constant equal to or higher than 8, wherein the first signal line and the second signal line are arranged to cross over each other at a first cross-over area, and wherein
the third dielectric layer is disposed on the further passivation layer between the first signal line and the second signal line at least at the first cross-over area.

8. The pixel structure according to claim 7, wherein the common line and the first signal line are arranged to cross over each other at a second cross-over area, and wherein
the third dielectric layer is disposed on the further passivation layer also between the common line and the first signal line at least at the second cross-over area.

9. The pixel structure according to claim 1, further comprising:
a pixel electrode electrically connected to the drain electrode, wherein the third capacitor electrode is electrically connected to the pixel electrode, the second capacitor electrode is electrically connected to common line, and the first capacitor electrode is electrically connected to the third capacitor electrode through a via.

10. The pixel structure according to claim 1, wherein the first capacitor electrode is electrically connected to the common line, the second capacitor electrode is electrically connected to the drain electrode, and the first capacitor electrode is electrically connected to the third capacitor electrode through a via.

11. The pixel structure according to claim 1, further comprising:
a pixel electrode electrically connected to the drain electrode, wherein the third capacitor electrode is electrically connected to the pixel electrode, the second capacitor electrode is electrically connected to the common line, and the first capacitor electrode is electrically connected to the third capacitor electrode through a via and wherein the storage capacitor further comprises an insulating layer between the second capacitor electrode and the second dielectric layer.

12. The pixel structure according to claim 11, wherein the storage capacitor further comprises a fourth dielectric layer disposed between the third capacitor electrode and the passivation layer, wherein the fourth dielectric layer having a dielectric constant equal to or lower than 5.

13. The pixel structure according to claim 1, wherein the first capacitor electrode is electrically connected to the common line, the second capacitor electrode is electrically connected to the drain electrode and the third capacitor electrode is electrically connected to the first capacitor electrode through a via, and wherein the storage capacitor further comprises an insulating layer disposed between the second capacitor electrode and the second dielectric layer.

14. The pixel structure of claim 1, wherein the first dielectric layer and the second dielectric layer are made from a material selected from the group consisting of $Al_2O_3$, $Ta2O_5$ and $HfO_2$.

15. A pixel structure in a display panel having a substrate, comprising:
a switching element comprising:
a gate electrode disposed on the substrate,
a semiconductor layer disposed on the gate electrode, and
a drain electrode and a source electrode disposed on the semiconductor layer;
a storage capacitor comprising a first capacitor electrode, a second capacitor electrode a third capacitor electrode, and a passivation layer disposed between the second capacitor electrode and the third capacitor electrode, the first capacitor electrode disposed on the substrate, wherein a dielectric material is provided between the first capacitor electrode and the second capacitor electrode in the storage capacitor, and between the gate electrode and the semiconductor layer in the switching element, the dielectric material having a dielectric constant higher than 8,
a pixel electrode electrically connected to the drain electrode;
a first signal line electrically connected to the source electrode;
a second signal line electrically connected to the gate electrode;
a common line electrically connected to the second capacitor electrode of the storage capacitor; and
a dielectric layer disposed at least on the second signal line, wherein the first signal line and the second signal line are arranged to cross over each other over the dielectric layer at a cross-over area, the dielectric layer having a dielectric constant equal to or lower than 5.

16. The pixel structure according to claim 15, wherein the dielectric material is also provided over the second signal line at least at the cross-over area between the first signal line and the second signal line.

17. The pixel structure according to claim 16, further comprising:
a passivation layer disposed on the drain electrode, the source electrode and a part of the semiconductor layer in the switching element, and
a second gate electrode disposed on the passivation layer over the switching element, the second gate electrode electrically connected to the gate electrode through a via, and wherein the passivation layer is also disposed between the dielectric layer and the second signal line at least at the cross over area.

18. A method for fabricating a pixel structure for use in a display panel having a substrate, the pixel structure comprising a switching element, a storage capacitor, a pixel electrode, a first signal line, a second signal line and a common line, wherein the switching element comprises:
   a gate electrode,
   a semiconductor layer, and
   a drain electrode and a source electrode; and
the storage capacitor comprising a first capacitor electrode, a second capacitor electrode and a third capacitor electrode, said method comprising the steps of:
disposing a first metal layer on the substrate for providing the first capacitor electrode, the gate electrode and the second signal line, wherein the first capacitor electrode, the gate electrode, and the second signal line are spaced from each other;
disposing a first dielectric material for providing a first dielectric layer on the gate electrode and a second dielectric layer on the first capacitor electrode, the first dielectric material having a dielectric constant equal to or higher than 8,
disposing a semiconducting material on the first dielectric layer for providing the semiconductor layer;
disposing a second dielectric material for providing a third dielectric layer on part of the substrate at least between the gate electrode and the first capacitor electrode, and a fourth dielectric layer on the second signal line and on another part of the substrate at least between the second signal line and the gate electrode, the second dielectric material having a dielectric constant equal to or lower than 5;
disposing a second metal layer for providing
   the drain electrode and the source electrode of the switching element,
   the second capacitor electrode of the storage capacitor, and
   the first signal line and the common line on the fourth dielectric layer, wherein two of the first signal line, the second signal line and the common line are arranged to cross over each other at a cross-over area such that the second dielectric material is at least disposed at the cross-over area;
disposing a passivation layer over the second capacitor electrode and the third dielectric layer; and
disposing an electrically conductive layer on part of the passivation layer for providing the third capacitor electrode and the pixel electrode, the pixel electrode electrically connected to the drain electrode through a first via, the third capacitor electrode electrically connected to the first capacitor electrode through a second via.

19. The method according to claim 18, wherein the first dielectric material comprises a continuous layer over the gate electrode, the first capacitor electrode and the second signal line, said method further comprising the steps of:
   disposing an insulating layer on the first dielectric material;
   disposing a semiconducting material on part of the insulating layer for providing the semiconductor layer of the switching element;
   disposing a second metal layer on the semiconductor layer and part of the insulating layer for providing the drain electrode and the source electrode of the switching element, and on a different part of the insulating layer for providing the common line and the second capacitor electrode of the storage capacitor;
   disposing a passivation layer at least over the drain electrode and the source electrode of the switching element, the second capacitor electrode of the storage capacitor, and the common line;
   disposing a second dielectric material over the passivation layer, the second dielectric material having a dielectric constant equal to or lower than 5;
   patterning the passivation layer and the second dielectric material to provide a first via to the source electrode, a second via to the drain electrode, and patterning the insulating layer, the passivation layer, the second dielectric material and the first dielectric material to provide a third via to the first capacitor electrode;
   disposing a third metal layer on part of the second dielectric material for providing the first signal line, the first signal line electrically connected to the source electrode through the first via, the first signal line also crossing over the common line, and
   disposing an electrically conductive layer over a different part of the second dielectric material for providing a pixel electrode, wherein the pixel electrode is electrically connected to the drain electrode through the second via and connected to the first capacitor electrode through the third via.

20. The method according to claim 18, wherein the first dielectric material comprising a continuous layer over the gate electrode, the first capacitor electrode, a first segment of the second signal line and a second segment of the second signal line, said method further comprising the steps of:
   disposing an insulating layer on the first dielectric material;
   disposing a semiconducting material on part of the insulating layer for providing the semiconductor layer of the switching element;
   disposing a second metal layer on the semiconductor layer and part of the insulating layer for providing the drain electrode and the source electrode of the switching element, and on a different part of the insulating layer for providing the second capacitor electrode of the storage capacitor;
   disposing a passivation layer over the drain electrode and the source electrode of the switching element, the second capacitor electrode of the storage capacitor, the first segment of the second signal line and the second segment of the second signal line;
   patterning the passivation layer to provide a first via to the source electrode and a third via to the drain electrode, and patterning the passivation layer, the insulating layer and the first dielectric material to provide a second via to the first segment of the second signal line and a fourth via to the first capacitor electrode;
   disposing a second dielectric material on the passivation layer over the second segment of the second signal line, the second dielectric material having a dielectric constant lower than or equal to 5;
   disposing a third metal layer on the second dielectric material for providing the first signal line, and on part of the passivation layer for providing a second gate electrode in the switching element, the second gate element electrically connected to the first segment of the second signal line through the second via; and
   disposing an electrically conducting layer on a different part of the passivation layer for providing a pixel electrode, the pixel electrode electrically connected to the drain electrode through the third via and connected to the first capacitor electrode through the fourth via.

21. The method according to claim 20, wherein the second metal layer is also disposed on the insulating layer for providing the common line, the common line and the second signal line arranged to cross over each other at a cross-over area;

the second metal layer is patterned to produce a gap in the common line at the cross-over area;

the passivation layer is also disposed on the common line and on the insulating layer at the gap of the common line;

the second dielectric material is also disposed on the passivation layer to provide a dielectric segment at the cross-over area, and the third metal layer is also disposed on the dielectric segment of the second dielectric material at the cross-over area for providing a bridge electrically connecting the common line on both sides of the gap.

22. The method according to claim 18, wherein the first metal layer also provides a common line on the substrate, and the first dielectric material is a continuous layer disposed on the gate electrode, the first capacitor electrode, a first segment of the second signal line and the second segment of the second signal line, said method further comprising the steps of:

disposing an insulating layer on the first dielectric material;

disposing a semiconducting material on part of the insulating layer for providing the semiconductor layer of the switching element;

disposing a second metal layer on the semiconductor layer and part of the insulating layer for providing the drain electrode and the source electrode of the switching element, and on another part of the insulating layer for providing the second capacitor electrode of the storage capacitor;

disposing a passivation layer over the drain electrode and the source electrode of the switching element, the second capacitor electrode of the storage capacitor, the common line, the first segment of the second signal line, the second segment of the second signal line and different part of the insulating layer;

patterning the passivation layer to provide a first via to the source electrode and a fourth via to the drain electrode, and patterning the passivation layer, the insulating layer and the first dielectric material to provide a second via to the first capacitor electrode, and a third via to the first segment of the second signal line;

disposing a second dielectric material on the passivation layer over the second segment of the second signal line and the common line, the second dielectric material having a dielectric constant lower than or equal to 5;

disposing and patterning a third metal layer
  on the second dielectric material for providing the first signal line over the second segment of the second signal line and the common line, the first signal line electrically connected to the source electrode through the first via, and
  on part of the passivation layer for providing a third capacitor electrode and a second gate electrode in the switching element, the second gate electrode electrically connected to the first segment of the second signal line through the third via, the third capacitor electrode electrically connected to the first capacitor electrode through the second via; and disposing an electrically conducting layer on different part of the passivation layer for providing the pixel electrode, the pixel electrode electrically connected to the drain electrode through the fourth via.

* * * * *